(12) United States Patent
Hsiung et al.

(10) Patent No.: US 12,408,371 B2
(45) Date of Patent: Sep. 2, 2025

(54) NMOS HALF-BRIDGE POWER DEVICE AND MANUFACTURING METHOD THEREOF

(71) Applicant: Richtek Technology Corporation, HsinChu (TW)

(72) Inventors: Chih-Wen Hsiung, Hsinchu (TW); Wu-Te Weng, Hsinchu (TW); Ta-Yung Yang, Taoyuan (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 518 days.

(21) Appl. No.: 17/983,434

(22) Filed: Nov. 9, 2022

(65) Prior Publication Data
US 2023/0178648 A1 Jun. 8, 2023

Related U.S. Application Data

(60) Provisional application No. 63/264,934, filed on Dec. 3, 2021.

(30) Foreign Application Priority Data

May 5, 2022 (TW) ................... 111116926

(51) Int. Cl.
*H03F 3/217* (2006.01)
*H02M 3/335* (2006.01)
(Continued)

(52) U.S. Cl.
CPC ........... *H10D 30/65* (2025.01); *H03F 3/2173* (2013.01); *H10D 30/0221* (2025.01);
(Continued)

(58) Field of Classification Search
CPC .. H10D 30/65; H10D 30/0221; H10D 30/603; H10D 62/393; H10D 64/516; H10D 30/0281; H10D 62/371; H10D 84/0151; H10D 84/0156; H10D 84/038; H10D 84/83; H10D 84/859; H10D 84/0188; H10D 62/116; H10D 84/017; H10D 84/0191;
(Continued)

(56) References Cited

U.S. PATENT DOCUMENTS 4,910,563 A * 3/1990 Tuska ................... H10D 84/85
257/329
6,744,649 B1 * 6/2004 Yang ................... H02M 3/3376
363/41
(Continued)

*Primary Examiner* — Maliheh Malek
(74) *Attorney, Agent, or Firm* — Tung & Associates

(57) ABSTRACT

An NMOS half-bridge power device includes: a semiconductor layer, a plurality of insulation regions, a first N-type high voltage well and a second N-type high voltage well, which are formed by one same ion implantation process, a first P-type high voltage well and a second P-type high voltage well, which are formed by one same ion implantation process, a first drift oxide region and a second drift oxide region, which are formed by one same etch process including etching a drift oxide layer; a first gate and a second gate, which are formed by one same etch process including etching a poly silicon layer, a first P-type body region and a second P-type body region, which are formed by one same ion implantation process, a first N-type source and a first N-type drain, and a second N-type source and a second N-type drain.

22 Claims, 16 Drawing Sheets

(51) Int. Cl.
    *H02M 7/219*         (2006.01)
    *H10D 30/01*         (2025.01)
    *H10D 30/60*         (2025.01)
    *H10D 30/65*         (2025.01)
    *H10D 62/17*         (2025.01)
    *H10D 64/27*         (2025.01)

(52) U.S. Cl.
    CPC ......... *H10D 30/603* (2025.01); *H10D 62/393* (2025.01); *H10D 64/516* (2025.01); *H02M 3/33571* (2021.05); *H02M 7/219* (2013.01)

(58) Field of Classification Search
    CPC ......... H10D 84/85; H01L 21/761; H02P 7/04; H02M 3/33571; H02M 1/0085; H02M 1/4233; H02M 7/5387; H02M 7/219; H03F 3/2173
    See application file for complete search history.

(56) References Cited

U.S. PATENT DOCUMENTS

| | | | | |
|---|---|---|---|---|
| 7,459,750 | B2* | 12/2008 | Ludikhuize | H10D 84/811 |
| | | | | 257/334 |
| 8,063,444 | B2* | 11/2011 | Chang | H10D 30/603 |
| | | | | 257/E27.06 |
| 8,193,559 | B2* | 6/2012 | Haeberlen | H10D 30/664 |
| | | | | 257/773 |
| 8,288,820 | B2* | 10/2012 | Kocon | H10D 30/603 |
| | | | | 327/564 |
| 8,293,612 | B2* | 10/2012 | Lee | H10D 84/0188 |
| | | | | 438/296 |
| 9,093,914 | B2* | 7/2015 | Tseng | H02M 3/07 |
| 9,614,074 | B1* | 4/2017 | Lin | H10D 30/603 |
| 10,249,637 | B2* | 4/2019 | Torii | H10D 64/685 |
| 10,461,624 | B2* | 10/2019 | Tsu | H02M 1/08 |
| 11,935,950 | B2* | 3/2024 | Chen | H10D 30/0221 |
| 11,967,644 | B2* | 4/2024 | Wang | H10D 62/107 |
| 2004/0125619 | A1* | 7/2004 | Yang | H02M 3/3376 |
| | | | | 363/21.01 |
| 2005/0024897 | A1* | 2/2005 | Yang | H02M 1/38 |
| | | | | 363/21.06 |
| 2005/0199962 | A1* | 9/2005 | Suzuki | H10D 30/0221 |
| | | | | 257/368 |
| 2005/0280998 | A1* | 12/2005 | Lin | H05K 7/209 |
| | | | | 361/704 |
| 2006/0006462 | A1* | 1/2006 | Chang | H10D 62/116 |
| | | | | 257/E21.549 |
| 2006/0054967 | A1* | 3/2006 | Ludikhuize | H10D 84/856 |
| | | | | 257/E27.06 |
| 2008/0309256 | A1* | 12/2008 | Wang | H05B 41/2828 |
| | | | | 315/307 |
| 2010/0001345 | A1* | 1/2010 | Furuhata | H10D 84/017 |
| | | | | 257/E29.261 |
| 2010/0187606 | A1* | 7/2010 | Kobayashi | H10D 84/017 |
| | | | | 257/E29.256 |
| 2010/0315159 | A1* | 12/2010 | Kocon | H10D 30/0281 |
| | | | | 257/E21.409 |
| 2011/0241170 | A1* | 10/2011 | Haeberlen | H10D 84/038 |
| | | | | 257/532 |
| 2013/0015523 | A1* | 1/2013 | You | H10D 30/65 |
| | | | | 438/286 |
| 2013/0200453 | A1* | 8/2013 | Park | H10D 84/401 |
| | | | | 257/338 |
| 2013/0341717 | A1 | 12/2013 | Chen et al. | |
| 2014/0001549 | A1* | 1/2014 | Bode | H10D 30/0285 |
| | | | | 438/478 |
| 2014/0118029 | A1* | 5/2014 | Tseng | H03K 5/1536 |
| | | | | 327/79 |
| 2014/0191732 | A1* | 7/2014 | Tseng | H02M 1/36 |
| | | | | 320/166 |
| 2014/0320174 | A1* | 10/2014 | Lu | H10D 30/65 |
| | | | | 327/109 |
| 2016/0099349 | A1* | 4/2016 | Parris | H10D 62/107 |
| | | | | 438/286 |
| 2017/0179279 | A1* | 6/2017 | Lin | H10D 30/0221 |
| 2017/0200785 | A1* | 7/2017 | Janssens | H01L 21/76224 |
| 2018/0138797 | A1* | 5/2018 | Tsu | H02M 3/33523 |
| 2018/0174887 | A1* | 6/2018 | Chuang | H10D 62/393 |
| 2018/0240876 | A1 | 8/2018 | Tu et al. | |
| 2018/0261617 | A1* | 9/2018 | Torii | H10D 64/685 |
| 2018/0277531 | A1* | 9/2018 | Takeuchi | H10D 62/127 |
| 2019/0081045 | A1* | 3/2019 | Lin | H10D 30/65 |
| 2021/0175165 | A1* | 6/2021 | Shibuya | H01L 25/072 |
| 2023/0081508 | A1* | 3/2023 | Tu | H10D 30/603 |
| | | | | 257/288 |
| 2023/0178438 | A1* | 6/2023 | Weng | H10D 84/0135 |
| | | | | 438/294 |
| 2023/0197730 | A1* | 6/2023 | Weng | H10D 30/65 |
| | | | | 257/338 |
| 2024/0106342 | A1* | 3/2024 | Hu | H01L 24/73 |
| 2024/0113115 | A1* | 4/2024 | Naik | H10D 30/0289 |
| 2024/0194679 | A1* | 6/2024 | Bienvenu | H10D 84/8312 |
| 2024/0339522 | A1* | 10/2024 | Xu | H10D 84/038 |

\* cited by examiner

NMOS HALF-BRIDGE POWER DEVICE AND MANUFACTURING METHOD THEREOF

CROSS REFERENCE

The present invention claims priority to US 63/264,934 filed on Dec. 3, 2021 and claims priority to TW 111116926 filed on May 5, 2022.

BACKGROUND OF THE INVENTION

Field of Invention

The present invention relates to an NMOS half-bridge power device and a manufacturing method thereof; particularly, it relates to an NMOS half-bridge power device integrating an NMOS upper gate device and an NMOS lower gate device and a manufacturing method thereof.

Description of Related Art

Conventionally, a buck power stage circuit comprises a half-bridge switching circuit constituted by an upper gate power device and a lower gate power device. The upper gate power device and the lower gate power device are separately formed by different manufacturing processes, which has the drawbacks of limited application range and high manufacturing cost.

In view of the above, to overcome the drawbacks in the prior art, the present invention proposes an NMOS half-bridge power device integrating an NMOS upper gate device and an NMOS lower gate device therein, which can be manufactured by an integration process.

SUMMARY OF THE INVENTION

From one perspective, the present invention provides an NMOS half-bridge power device, comprising: a semiconductor layer, which is formed on a substrate; a plurality of insulation regions, which are formed on the semiconductor layer, for defining an NMOS upper gate device region and an NMOS lower gate device region, wherein an NMOS upper gate device is formed in the NMOS upper gate device region, whereas, an NMOS lower gate device is formed in the NMOS lower gate device region; a first N-type buried layer, which is formed in the NMOS upper gate device region; a first N-type high voltage isolation region and a second N-type high voltage isolation region, which are formed in the semiconductor layer of the NMOS upper gate device region by one same ion implantation process; a first N-type high voltage well and a second N-type high voltage well, which are formed in the semiconductor layer of the NMOS upper gate device region and the semiconductor layer of the NMOS lower gate device region, respectively, by one same ion implantation process; a first P-type high voltage well and a second P-type high voltage well, which are formed in the semiconductor layer of the NMOS upper gate device region and the semiconductor layer of the NMOS lower gate device region, respectively, by one same ion implantation process; wherein the first N-type high voltage well and the first P-type high voltage well are in contact with each other in a channel direction, and wherein the second N-type high voltage well and the second P-type high voltage well are in contact with each other in the channel direction; a first drift oxide region and a second drift oxide region, which are formed, by one same etching process including etching a drift oxide layer, in the NMOS upper gate device region and in the NMOS lower gate device region, respectively; a first gate and a second gate, which are formed, by one same etching process including etching a polysilicon layer, in the NMOS upper gate device region and in the NMOS lower gate device region, respectively; a first P-type body region and a second P-type body region, which are formed in the semiconductor layer of the NMOS upper gate device region and the semiconductor layer of the NMOS lower gate device region, respectively, by one same ion implantation process; wherein a portion of the first P-type body region is located vertically below the first gate, and wherein the first P-type body region and the first N-type high voltage well are in contact with each other in the channel direction, wherein a portion of the second P-type body region is located vertically below the second gate, and wherein the second P-type body region and the second N-type high voltage well are in contact with each other in the channel direction; a first N-type source and a first N-type drain, which are formed, by one same ion implantation process, in the semiconductor layer of the NMOS upper gate device region, wherein the first N-type source and the first N-type drain are located below and outside two sides of the first gate, respectively, wherein a side of the first gate which is closer to the first N-type source is a source side and another side of the first gate which is closer to the first N-type drain is a drain side, and wherein the first N-type source is located in the first P-type body region, and the first N-type drain is located in the first N-type high voltage well; and a second N-type source and a second N-type drain, which are formed in the semiconductor layer of the NMOS lower gate device region by the one same ion implantation process that forms the first N-type source and the first N-type drain, wherein the second N-type source and the second N-type drain are located below and outside two sides of the second gate, respectively, wherein a side of the second gate which is closer to the second N-type source is a source side and another side of the second gate which is closer to the second N-type drain is a drain side, and wherein the second N-type source is located in the second P-type body region, and the second N-type drain is located in the second N-type high voltage well; wherein the first N-type buried layer is formed in the semiconductor layer and in the substrate and is vertically below the first N-type high voltage well and the first P-type high voltage well; wherein in the channel direction, the first N-type high voltage isolation region is in contact with a side of the first N-type high voltage well, wherein this side of the first N-type high voltage well is opposite to another side of the first N-type high voltage well which is in contact with the first P-type high voltage well; wherein in the channel direction, the second N-type high voltage isolation region is in contact with a side of the first P-type high voltage well, wherein this side of the first P-type high voltage well is opposite to another side of the first P-type high voltage well which is in contact with the first N-type high voltage well.

From another perspective, the present invention provides a manufacturing method of an NMOS half-bridge power device, wherein the NMOS half-bridge power device includes: an NMOS upper gate device and an NMOS lower gate device; the manufacturing method of the NMOS half-bridge power device comprising: forming a semiconductor layer on a substrate; forming a plurality of insulation regions on the semiconductor layer, for defining an NMOS upper gate device region and an NMOS lower gate device region, wherein an NMOS upper gate device is formed in the NMOS upper gate device region, whereas, an NMOS lower gate device is formed in the NMOS lower gate device region; forming a first N-type buried layer in the NMOS upper gate device region; forming a first N-type high voltage isolation region and a second N-type high voltage isolation region in the semiconductor layer of the NMOS upper gate device region by one same ion implantation process; forming a first N-type high voltage well and a second N-type high voltage well in the semiconductor layer of the NMOS upper gate device region and the semiconductor layer of the NMOS lower gate device region, respectively, by one same ion implantation process; forming a first P-type high voltage well and a second P-type high voltage well in the semiconductor layer of the NMOS upper gate device region and the semiconductor layer of the NMOS lower gate device region, respectively, by one same ion implantation process; wherein the first N-type high voltage well and the first P-type high voltage well are in contact with each other in a channel direction, and wherein the second N-type high voltage well and the second P-type high voltage well are in contact with each other in the channel direction; forming a drift oxide layer on the semiconductor layer, wherein the drift oxide layer overlays the NMOS upper gate device region and the NMOS lower gate device region; etching the drift oxide layer to form a first drift oxide region in the NMOS upper gate device region and to form a second drift oxide region in the NMOS lower gate device region by one same etching process; subsequent to the formation of the first drift oxide region and the second drift oxide region, forming a gate dielectric layer on the semiconductor layer, wherein the gate dielectric layer overlays the NMOS upper gate device region and the NMOS lower gate device region; forming a polysilicon layer on the gate dielectric layer, wherein the polysilicon layer overlays the NMOS upper gate device region and the NMOS lower gate device region; etching the polysilicon layer to forma first gate in the NMOS upper gate device region and to forma second gate in the NMOS lower gate device region by one same etching process; forming a first P-type body region and a second P-type body region in the semiconductor layer of the NMOS upper gate device region and the semiconductor layer of the NMOS lower gate device region, respectively, by one same ion implantation process; wherein a portion of the first P-type body region is located vertically below the first gate, and wherein the first P-type body region and the first N-type high voltage well are in contact with each other in the channel direction, wherein a portion of the second P-type body region is located vertically below the second gate, and wherein the second P-type body region and the second N-type high voltage well are in contact with each other in the channel direction; forming a first N-type source and a first N-type drain in the semiconductor layer of the NMOS upper gate device region by one same ion implantation process, wherein the first N-type source and the first N-type drain are located below and outside two sides of the first gate, respectively, wherein a side of the first gate which is closer to the first N-type source is a source side and another side of the first gate which is closer to the first N-type drain is a drain side, and wherein the first N-type source is located in the first P-type body region, and the first N-type drain is located in the first N-type high voltage well; and forming a second N-type source and a second N-type drain in the semiconductor layer of the NMOS lower gate device region by the one same ion implantation process that forms the first N-type source and the first N-type drain, wherein the second N-type source and the second N-type drain are located below and outside two sides of the second gate, respectively, wherein a side of the second gate which is closer to the second N-type source is a source side and another side of the second gate which is closer to the second N-type drain is a drain side, and wherein the second N-type source is located in the second P-type body region, and the second N-type drain is located in the second N-type high voltage well; wherein the first N-type buried layer is formed in the semiconductor layer and in the substrate and is vertically below the first N-type high voltage well and the first P-type high voltage well; wherein in the channel direction, the first N-type high voltage isolation region is in contact with a side of the first N-type high voltage well, wherein this side of the first N-type high voltage well is opposite to another side of the first N-type high voltage well which is in contact with the first P-type high voltage well; wherein in the channel direction, the second N-type high voltage isolation region is in contact with a side of the first P-type high voltage well, wherein this side of the first P-type high voltage well is opposite to another side of the first P-type high voltage well which is in contact with the first N-type high voltage well.

In one embodiment, the NMOS half-bridge power device further comprises: a first P-type conductive region, which is formed in the first P-type body region, wherein the first P-type conductive region serves as an electrical contact of the first P-type body region; and a second P-type conductive region, which is formed in the second P-type body region by the one same ion implantation process that forms the first P-type conductive region, wherein the second P-type conductive region serves as an electrical contact of the second P-type body region.

In one embodiment, the NMOS half-bridge power device further comprises: a second N-type buried layer, which is formed in the NMOS lower gate device region; and a third N-type high voltage isolation region and a fourth N-type high voltage isolation region, which are formed in the semiconductor layer of the NMOS lower gate device region by the one same ion implantation process that forms the first N-type high voltage isolation region and the second N-type high voltage isolation region; wherein the second N-type buried layer is formed in the semiconductor layer and in the substrate and is vertically below the second N-type high voltage well and the second P-type high voltage well; wherein in the channel direction, the third N-type high voltage isolation region is in contact with aside of the second N-type high voltage well, wherein the side of the second N-type high voltage well is opposite to another side of the second N-type high voltage well which is in contact with the second P-type high voltage well; wherein in the channel direction, the fourth N-type high voltage isolation region is in contact with a side of the second P-type high voltage well, wherein the side of the second P-type high voltage well is opposite to another side of the second P-type high voltage well which is in contact with the second N-type high voltage well.

In one embodiment, the first N-type source is electrically connected to the second N-type source, and the first P-type conductive region is electrically connected to the second N-type source.

In one embodiment, the first gate of the NMOS upper gate device has a gate length of 0.4~1 μm, wherein a length of a portion where the first gate overlays the first drift oxide region is 0.1~0.4 μm.

In one embodiment, the second gate of the NMOS lower gate device has a gate length of 0.4~1 μm, wherein a length of a portion where the second gate overlays the second drift oxide region is 0.1~0.4 μm.

In one embodiment, the semiconductor layer is a P-type semiconductor epitaxial layer having a volume resistivity of 45 Ohm-cm.

In one embodiment, each of the first drift oxide region and the second drift oxide region has a thickness ranging between 400 Å and 450 Å.

In one embodiment, each of the dielectric layer of the first gate and the dielectric layer of the second gate has a thickness ranging between 80 Å and 100 Å.

In one embodiment, a gate driving voltage of the NMOS upper gate device region is 3.3V, and the first N-type drain is electrically connected to a voltage level ranging between 6V and In one embodiment, the NMOS half-bridge power device has a minimum feature size of 0.18 μm.

Advantages of the present invention include: that, the present invention can form different units of the NMOS upper gate device and the NMOS lower gate device of the NMOS half-bridge switching circuit at the same time by one same manufacturing process to integrate the NMOS half-bridge switching circuit into one NMOS half-bridge power device; and that, the present invention forms an isolation region in the semiconductor layer to electrically isolate the NMOS upper gate device and the NMOS lower gate device.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations among the process steps and the layers, while the shapes, thicknesses, and widths are not drawn in actual scale.

Figure 1:
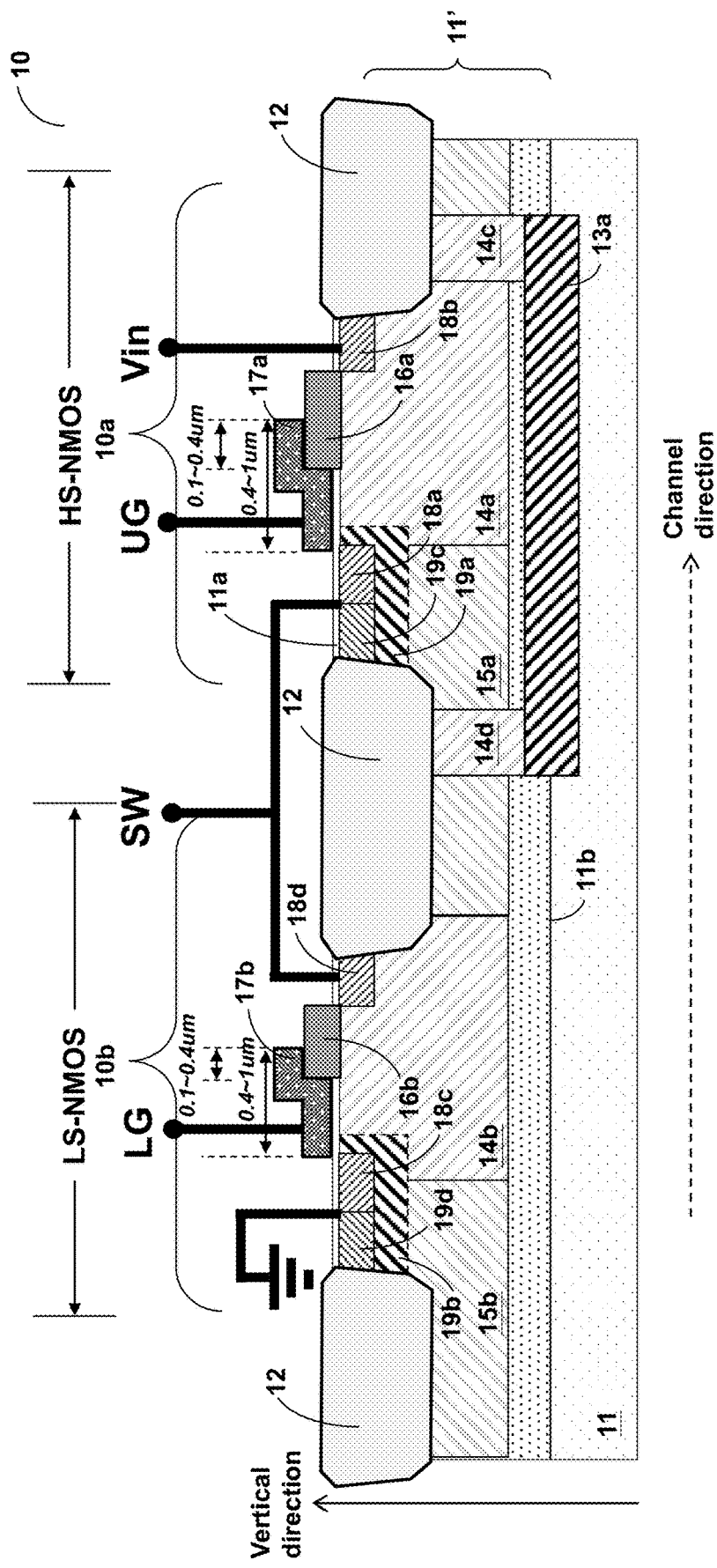
FIG. 1 shows a cross-section view of an NMOS half-bridge power device according to an embodiment of the present invention.

Please refer to FIG. 1, which shows a cross-section view of an NMOS half-bridge power device according to an embodiment of the present invention. As shown in FIG. 1, the NMOS half-bridge power device 10 comprises: a semiconductor layer 11', insulation regions 12, a first N-type buried layer 13a, a first N-type high voltage isolation region 14c and a second N-type high voltage isolation region 14d which are formed by one same ion implantation process, a first N-type high voltage well 14a and a second N-type high voltage well 14b which are formed by one same ion implantation process, a first P-type high voltage well 15a and a second P-type high voltage well 15b which are formed by one same ion implantation process, a first drift oxide region 16a and a second drift oxide region 16b which are formed by one same etching process including etching a drift oxide layer, a first gate 17a and a second gate 17b which are formed by one same etching process including etching a polysilicon layer, a first P-type body region 19a and a second P-type body region 19b which are formed by one same ion implantation process, a first N-type source 18a and a first N-type drain 18b, and a second N-type source 18c and a second N-type drain 18d.

A semiconductor layer 11' is formed on the substrate 11. The semiconductor layer 11' has a top surface 11a and a bottom surface 11b opposite to the top surface 11a in a vertical direction (as indicated by the direction of the solid arrow in FIG. 1, and all occurrences of the term "vertical direction" in this specification refer to the same direction). The semiconductor layer 11', for example, is formed on the substrate 11 by an epitaxial process, or is a part of the substrate 11. The semiconductor layer 11' can be formed by various methods known to a person having ordinary skill in the art, so the details thereof are not redundantly explained here.

Please still refer to FIG. 1. Plural insulation regions 12 are formed on the semiconductor layer 11', for defining an NMOS upper gate device region HS-NMOS and an NMOS lower gate device region LS-NMOS, wherein an NMOS upper gate device 10a is formed in the NMOS upper gate device region HS-NMOS, whereas, an NMOS lower gate device 10b is formed in the NMOS lower gate device region LS-NMOS. The insulation regions 12 can be, for example but not limited to, a shallow trench isolation (STI) structure shown in FIG. 1.

In this embodiment, the NMOS upper gate device 10a includes: a first N-type buried layer 13a, a first N-type high voltage isolation region 14c, a second N-type high voltage isolation region 14d, a first N-type high voltage well 14a, a first P-type high voltage well 15a, a first drift oxide region 16a, a first gate 17a, a first N-type source 18a, a first N-type drain 18b, a first P-type body region 19a and a first P-type conductive region 19c. The NMOS lower gate device 10b includes: a second N-type high voltage well 14b, a second P-type high voltage well 15b, a second drift oxide region 16b, a second gate 17b, a second N-type source 18c, a second N-type drain 18d, a second P-type body region 19b, a second P-type conductive region 19d.

Please still refer to FIG. 1. The first N-type buried layer 13a is formed in the NMOS upper gate device region HS-NMOS. The first N-type buried layer 13a is formed in the semiconductor layer 11' and in the substrate 11 and is vertically below the first N-type high voltage well 14a and the first P-type high voltage well 15a. The first N-type high voltage isolation region 14c and the second N-type high voltage isolation region 14d are formed in the semiconductor layer 11' of the NMOS upper gate device region HS-NMOS by one same ion implantation process. In a channel direction (as indicated by the direction of the dashed arrow shown in FIG. 1, and all occurrences of the term "channel direction" in this specification refer to the same direction), the first N-type high voltage isolation region 14c is in contact with a side of the first N-type high voltage well 14a, wherein this side of the first N-type high voltage well 14a is opposite to another side of the first N-type high voltage well 14a which is in contact with the first P-type high voltage well 15a. In the channel direction, the second N-type high voltage isolation region 14d is in contact with a side of the first P-type high voltage well 15a, wherein this side of the first P-type high voltage well 15a is opposite to another side of the first P-type high voltage well 15a which is in contact with the first N-type high voltage well 14a. The first N-type buried layer 13a, the first N-type high voltage isolation region 14c and the second N-type high voltage isolation region 14d together constitute a device isolation region, wherein such device isolation region entirely encompasses the lower boundary of the NMOS upper gate device 10a below the top surface 11a of the semiconductor layer 11', so that below the top surface 11a of the semiconductor layer 11', the NMOS upper gate device 10a is electrically isolated from other devices which are formed in the semiconductor layer 11', such as the NMOS lower gate device 10b.

Please still refer to FIG. 1. The first N-type high voltage well 14a and the second N-type high voltage well 14b are formed in the semiconductor layer 11' of the NMOS upper gate device region HS-NMOS and the semiconductor layer 11' of the NMOS lower gate device region LS-NMOS, respectively, by one same ion implantation process. Both the first N-type high voltage well 14a and the second N-type high voltage well 14b are below and in contact with the top surface 11a. A part of the first N-type high voltage well 14a is located vertically below and in contact with the first gate 17a, which serve as a drift current channel in an ON operation of the NMOS upper gate device 10a. Besides, a part of the second N-type high voltage well 14b is located vertically below and in contact with the second gate 17b, which serve as a drift current channel in an ON operation of the NMOS lower gate device 10b.

Please still refer to FIG. 1. The first P-type high voltage well 15a and the second P-type high voltage well 15b are formed in the semiconductor layer 11' of the NMOS upper gate device region HS-NMOS and the semiconductor layer 11' of the NMOS lower gate device region LS-NMOS, respectively, by one same ion implantation process. The first N-type high voltage well 14a and the first P-type high voltage well 15a are in contact with each other in the channel direction. The second N-type high voltage well 14b and the second P-type high voltage well 15b are in contact with each other in the channel direction. Both the first P-type high voltage well 15a and the second P-type high voltage well 15b are below and in contact with the top surface 11a.

The first drift oxide region 16a and the second drift oxide region 16b are formed, by one same etching process including etching a drift oxide layer, in the NMOS upper gate device region HS-NMOS and in the NMOS lower gate device region LS-NMOS, respectively. The first drift oxide region 16a and the second drift oxide region 16b are formed on the semiconductor layer 11', and are located a drift region of the NMOS upper gate device 10a and a drift region of the NMOS lower gate device 10b, respectively.

The first gate 17a and a second gate 17b are formed, by one same etching process including etching a polysilicon layer, in the NMOS upper gate device region HS-NMOS and in the NMOS lower gate device region LS-NMOS, respectively.

The first gate 17a and the second gate 17b are formed on the top surface 11a of the semiconductor layer 11'. Each of the first gate 17a and the second gate 17b includes: a conductive layer, a spacer layer and a dielectric layer, wherein the dielectric layer is located on and in contact with the top surface 11a, which is known to a person having ordinary skill in the art, so the details thereof are not redundantly explained here.

Please still refer to FIG. 1. The first P-type body region 19a and the second P-type body region 19b are formed in the semiconductor layer 11' of the NMOS upper gate device region HS-NMOS and the semiconductor layer 11' of the NMOS lower gate device region LS-NMOS, respectively, by one same ion implantation process. The first P-type body region 19a and the first N-type high voltage well 14a are in contact with each other in the channel direction. The second P-type body region 19b and the second N-type high voltage well 14b are in contact with each other in the channel direction.

A portion of the first P-type body region 19a is located vertically below and in contact with the first gate 17a, which serve as an inversion current channel in an ON operation of the NMOS upper gate device 10a. And, a portion of the second P-type body region 19b is located vertically below and in contact with the second gate 17b, which serve as an inversion current channel in an ON operation of the NMOS lower gate device 10b.

The first N-type source 18a and the first N-type drain 18b are formed, by one same ion implantation process, in the semiconductor layer 11' of the NMOS upper gate device region HS-NMOS, wherein the first N-type source 18a and the first N-type drain 18b are located below and outside two sides of the first gate 17a in the channel direction, respectively, wherein the side of the first gate 17a which is closer to the first N-type source 18a is a source side and the side of the first gate 17a which is closer to the first N-type drain 18b is a drain side, and wherein the first N-type source 18a is located in the first P-type body region 19a, and the first N-type drain 18b is located in the first N-type high voltage well 14a.

In the vertical direction, the first N-type source 18a and the first N-type drain 18b are formed on and in contact with the top surface 11a. Besides, in the channel direction, a drift region of the NMOS upper gate device 10a lies between the first N-type drain 18b and the first P-type body region 19a, so as to separate the first N-type drain 18b from the first P-type body region 19a. And, a position in the first N-type high voltage well 14a which is near the top surface 11a serves as a drift current channel in an ON operation of the NMOS upper gate device 10a.

The second N-type source 18c and a second N-type drain 18d are formed in the semiconductor layer 11' of the NMOS lower gate device region LS-NMOS by one same ion implantation process, wherein the second N-type source 18c and the second N-type drain 18d are located below and outside two sides of the second gate 17b in the channel direction, respectively, wherein the side of the second gate 17b which is closer to the second N-type source 18c is a source side and the side of the second gate 17b which is closer to the second N-type drain 18d is a drain side, and wherein the second N-type source 18c is located in the second P-type body region 19b, and the second N-type drain 18d is located in the second N-type high voltage well 14b.

In the vertical direction, the second N-type source 18c and the second N-type drain 18d are formed on and in contact with the top surface 11a. Besides, in the channel direction, a drift region of the NMOS lower gate device 10b lies between the second N-type drain 18d and the second P-type body region 19b, so as to separate the second N-type drain 18d from the second P-type body region 19b. And, a position of the second N-type high voltage well 14b which is near the top surface 11a serves as a drift current channel in an ON operation of the NMOS lower gate device 10b.

As shown in FIG. 1, the first P-type conductive region 19c is formed in the first P-type body region 19a, wherein the first P-type conductive region 19c serves as an electrical contact of the first P-type body region 19a. The second P-type conductive region 19d is formed in the second P-type body region 19c by the one same ion implantation process that forms the first P-type conductive region 19c, wherein the second P-type conductive region 19c serves as an electrical contact of the second P-type body region 19b.

The first P-type conductive region 19c and the second P-type conductive region 19d are formed on and in contact with the top surface 11a. Besides, in the channel direction, the first P-type conductive region 19c is in contact with and electrically connected to the first N-type source 18a, whereas, the second P-type conductive region 19d is in contact with and electrically connected to the second N-type source 18c. As shown in FIG. 1, the first P-type conductive region 19c, the first N-type source 18a and the second N-type drain 18d are electrically connected to a switch node voltage SW. In addition, the second P-type conductive region 19d and the second N-type source 18c are electrically connected to ground. The first N-type drain 18b is electrically connected to an input voltage Vin. In a case wherein the NMOS half-bridge power device is applied to a buck power stage circuit, the switch node is electrically connected to one end of an inductor, whereas, another end of the inductor is electrically connected to an output voltage. A buck power stage circuit is known to a person having ordinary skill in the art, so the details thereof are not redundantly explained here.

In one embodiment, the first gate 17a of the NMOS upper gate device 10a has a gate length of 0.4~1 μm. And, a length of a portion where the first gate 17a overlays the first drift oxide region 16a is 0.1~0.4 μm.

In one embodiment, the second gate 17b of the NMOS lower gate device 10b has a gate length of 0.4~1 μm. And, a length of a portion where the second gate 17b overlays the second drift oxide region 16b is 0.1~0.4 μm.

In one embodiment, the semiconductor layer 11' is a P-type semiconductor epitaxial layer having a volume resistivity of 45 Ohm-cm.

In one embodiment, each of the first drift oxide region 16a and the second drift oxide region 16b is a chemical vapor deposition (CVD) oxide region.

In one embodiment, each of the first drift oxide region 16a and the second drift oxide region 16b has a thickness ranging between 400 Å to 450 Å.

In one embodiment, each of the dielectric layer of the first gate 17a and the dielectric layer of the second gate 17b has a thickness ranging between 80 Å to 100 Å.

In one embodiment, a gate driving voltage of the NMOS upper gate device 10a of the NMOS upper gate device region HS-NMOS is 3.3V, and the first N-type drain is electrically connected to a voltage level ranging between 6V and 36V.

In one embodiment, the NMOS half-bridge power device 10 has a minimum feature size of 0.18 μm.

Note that the term "inversion current channel" means thus. Taking this embodiment as an example, when the NMOS upper gate device 10a or the NMOS lower gate device 10b operates in ON operation due to the voltage applied to the first gate 17a or the second gate 17b, an inversion layer is formed below the first gate 17a or the second gate 17b, so that a conduction current flows through the region of the inversion layer, which is the inverse current channel known to a person having ordinary skill in the art, so the details thereof are not redundantly explained here.

Note that the term "drift current channel" means thus. Taking this embodiment as an example, the drift region provides a region where the conduction current passes through in a drifting manner when the NMOS upper gate device 10a or the NMOS lower gate device 10b operates in the ON operation, and the current path through the drift region is referred to as the "drift current channel", which is known to a person having ordinary skill in the art, so the details thereof are not redundantly explained here.

Note that the top surface 11a as referred to does not mean a completely flat plane but refers to the surface of the semiconductor layer 11'. In the present embodiment, for example, a part of the top surface 11a where the insulation region 12 is in contact with has a recessed portion.

Note that the term "gate" in the definition of this specification refers to a semiconductor structure which includes a conductive layer, a dielectric layer, and a spacer layer. More specifically, each of the gate 17a and the gate 17b includes a conductive layer which is conductive, a dielectric layer in contact with the top surface 11a, and a spacer layer which is electrically insulative. The conductive layer serves as an electrical contact of the corresponding first gate 17a or the corresponding second gate 17b, and is formed on and is in contact with the dielectric layer. The spacer layer is formed out of two sides of the conductive layer, as an electrical insulative layer of the corresponding first gate 17a or the corresponding second gate 17b.

Note that the above-mentioned "N-type" and "P-type" mean that impurities of corresponding conductivity types are doped in regions of the NMOS half-bridge power device (for example but not limited to the aforementioned first N-type high voltage well 14a and second N-type high voltage well 14b, the aforementioned first P-type high voltage well 15a and second N-type high voltage well 15b, the aforementioned first N-type source 18a and first N-type drain 18b, and the aforementioned second N-type source 19a and second N-type drain 19b, etc.), so that the regions have the corresponding "N-type" or "P-type", wherein "N-type" has conductivity type opposite to "P-type".

In addition, in the NMOS half-bridge power device, a lateral length of the drift region can be determined according to an operation voltage that the NMOS half-bridge power device is required to withstand in a normal operation, so that the NMOS half-bridge power device can operate at or higher than a specific voltage.

In addition, the term "power device" refers to a device configured to deliver power, wherein when the power device is constituted by a transistor (which is usually a high voltage device), a voltage applied to the drain thereof in normal operation is higher than a specific voltage, such as 5V.

Figure 2:
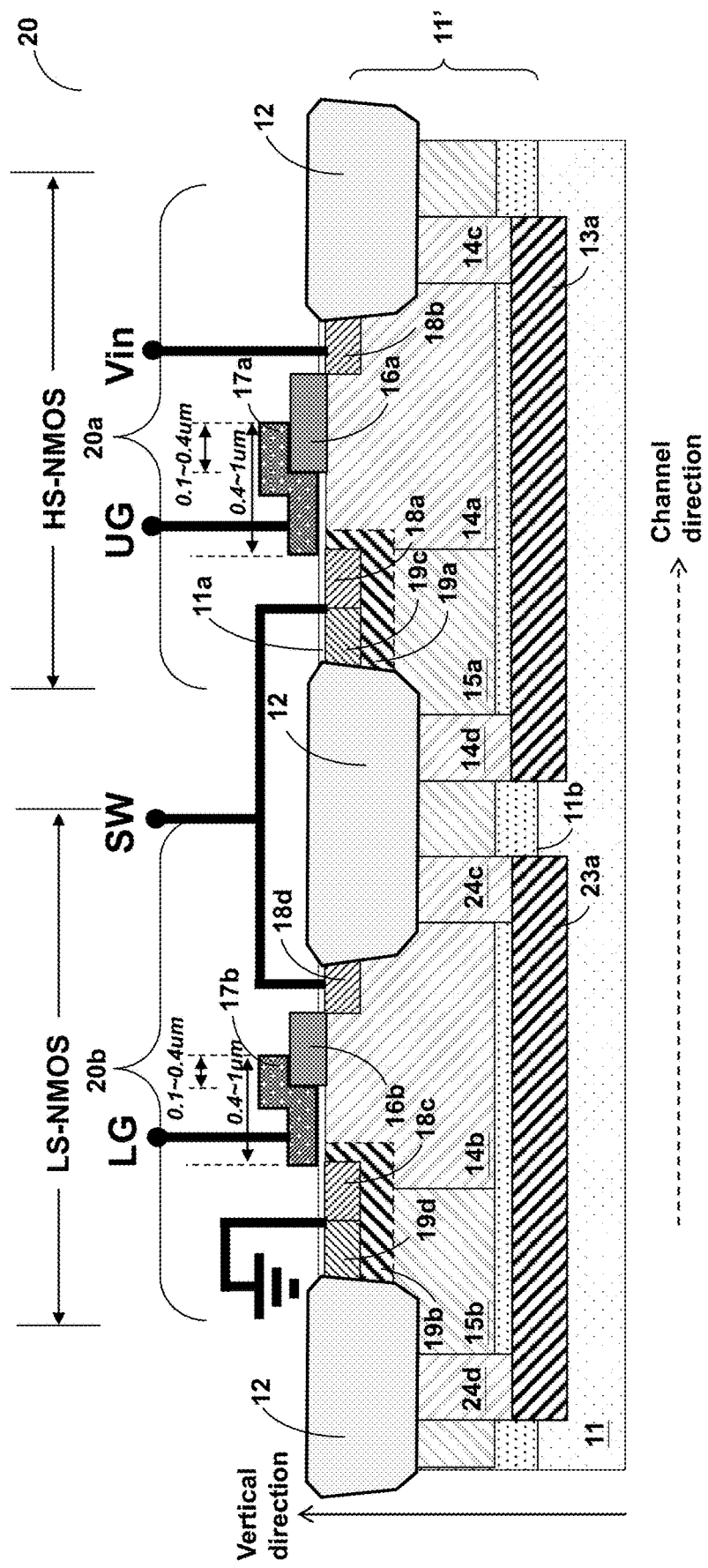
FIG. 2 shows a cross-section view of an NMOS half-bridge power device according to an embodiment of the present invention.

Please refer to FIG. 2, which shows a cross-section view of an NMOS half-bridge power device 20 according to an embodiment of the present invention. This embodiment shown in FIG. 2 is different from the embodiment shown in FIG. 1 in that: the NMOS half-bridge power device 20 further comprises a second N-type buried layer 23a, a third N-type high voltage isolation region 24c and a fourth N-type high voltage isolation region 24d.

The second N-type buried layer 23a is formed in the NMOS lower gate device region LS-NMOS by one same ion implantation process that forms the first N-type buried layer 13a. The second N-type buried layer 23a is formed in the semiconductor layer 11' and in the substrate 11 and is vertically below the second N-type high voltage well 14b and the second P-type high voltage well 15b.

The third N-type high voltage isolation region 24c and the fourth N-type high voltage isolation region 24d are formed in the semiconductor layer 11' of the NMOS lower gate device region LS-NMOS by the one same ion implantation process that forms the first N-type high voltage isolation region 14c and the second N-type high voltage isolation region 14d.

In the channel direction, the third N-type high voltage isolation region 24c is in contact with a side of the second N-type high voltage well 14b, wherein this side of the second N-type high voltage well 14b is opposite to another side of the second N-type high voltage well 14b which is in contact with the second P-type high voltage well 15b. In the channel direction, the fourth N-type high voltage isolation region 24d is in contact with a side of the second P-type high voltage well 15b, wherein this side of the second P-type high voltage well 15b is opposite to another side of the second P-type high voltage well 15b which is in contact with the second N-type high voltage well 14b.

The second N-type buried layer 23a, the third N-type high voltage isolation region 24c and the fourth N-type high voltage isolation region 24d together constitute a device isolation region, wherein such device isolation region entirely encompasses the lower boundary of the NMOS upper gate device 10b below the top surface 11a of the semiconductor layer 11', so that below the top surface 11a of the semiconductor layer 11', the NMOS upper gate device 10b is electrically isolated from other devices which are formed in the semiconductor layer 11', such as the NMOS lower gate device 10a.

The first N-type buried layer 13a and the second N-type buried layer 23a, can be formed by, for example but not limited to, anion implantation process, which implants N conductivity type impurities in the substrate 11 in the form of accelerated ions. Next, during or subsequent to the formation of the semiconductor layer 11', the first N-type buried layer 13a and the second N-type buried layer 23a are formed by thermal diffusion.

Figure 3A:
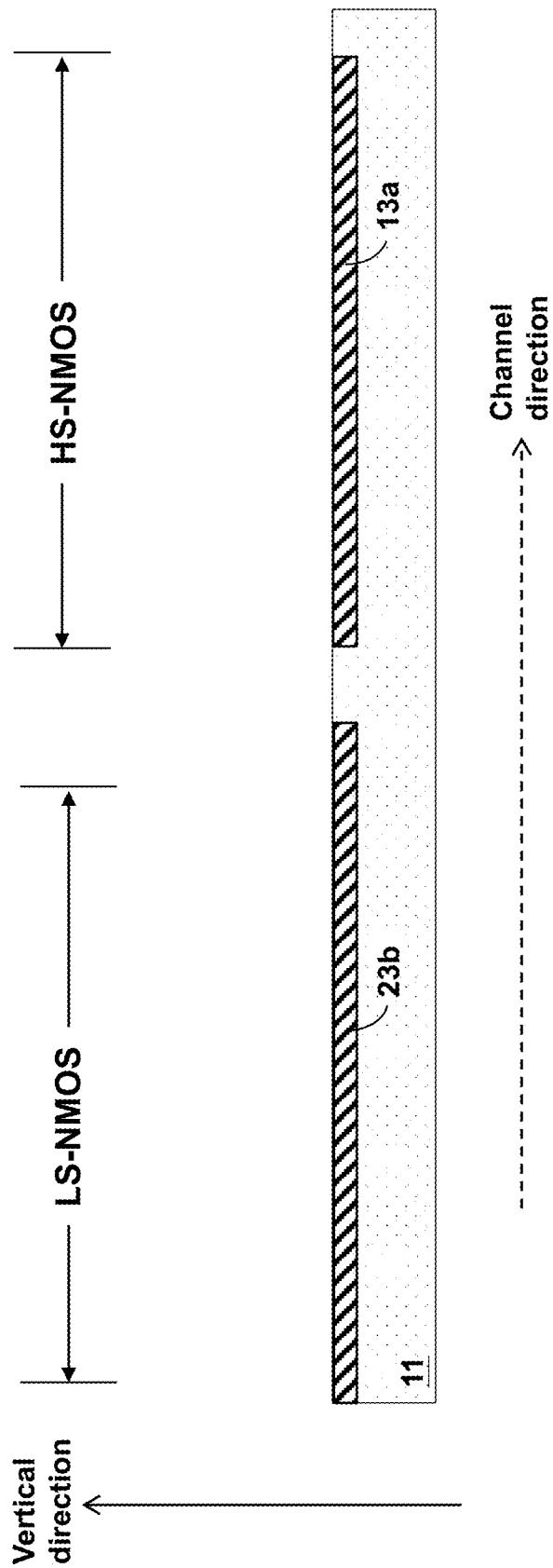
FIG. 3A to FIG. 3N show cross-section views of a manufacturing method of an NMOS half-bridge power device according to an embodiment of the present invention.
Figure 3B:
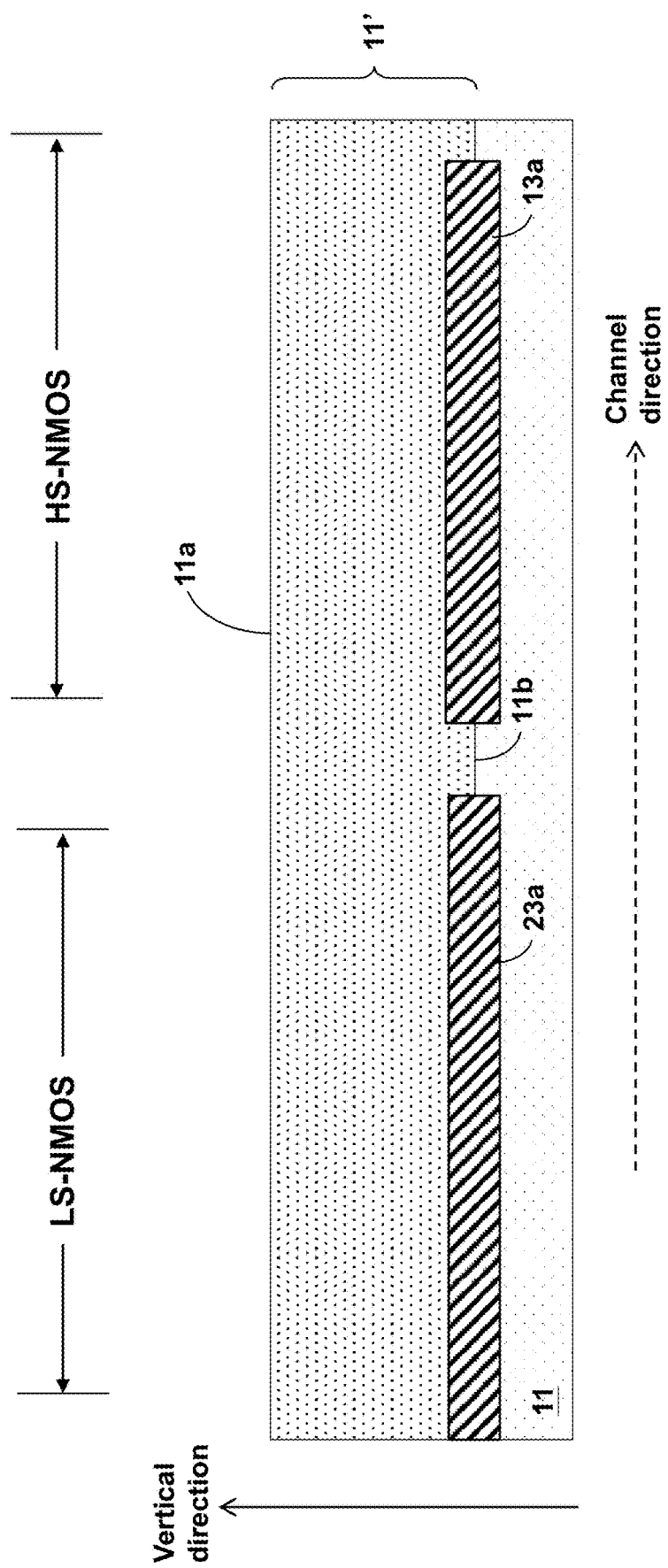
Figure 3C:
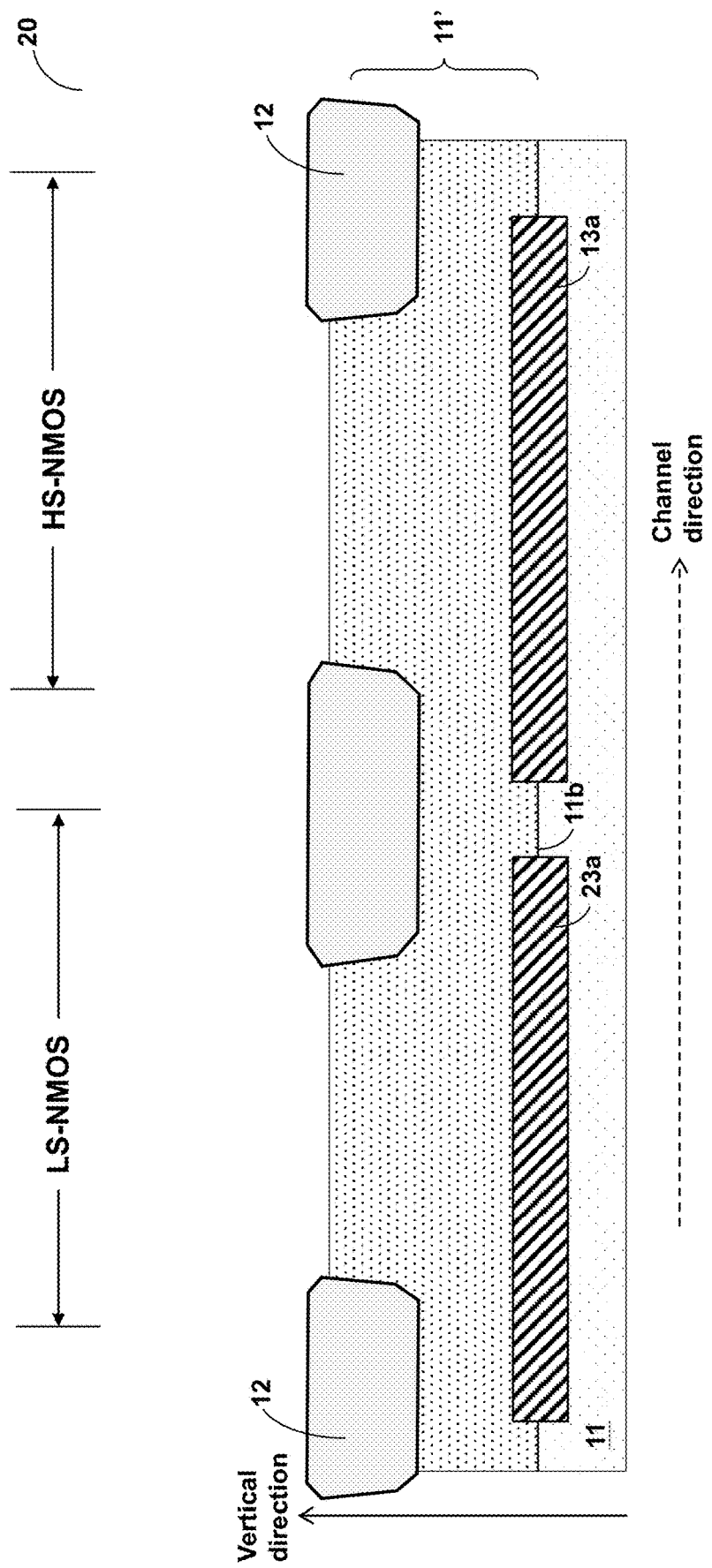
Figure 3D:
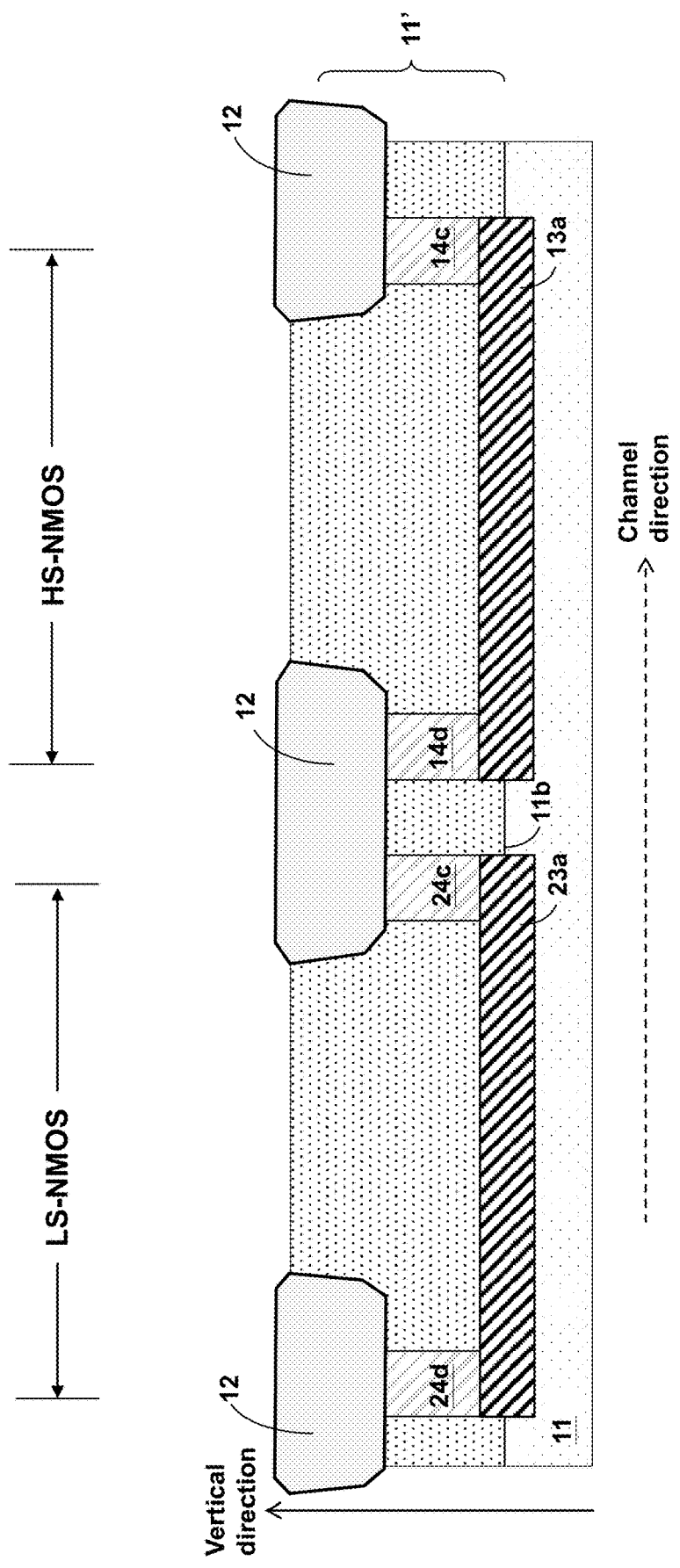
Figure 3E:
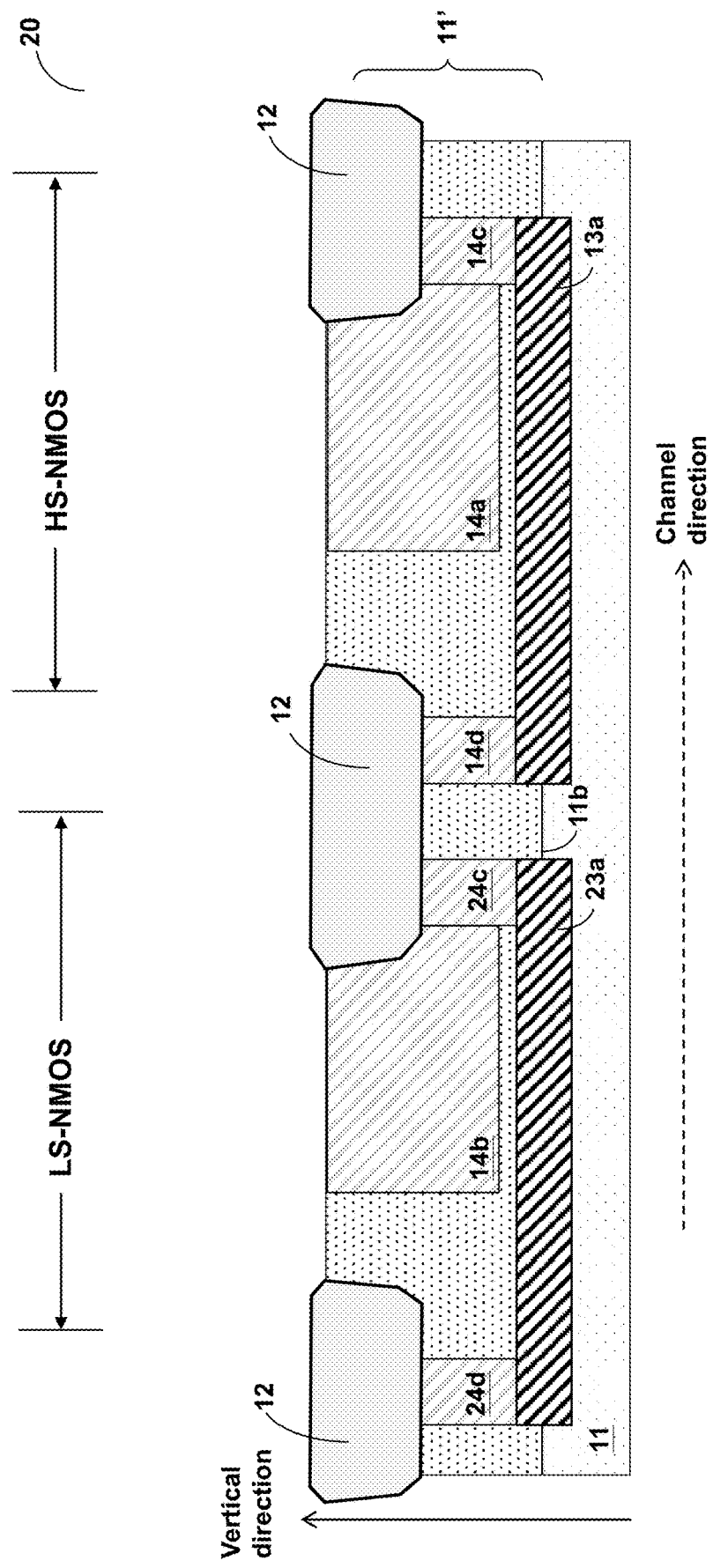
Figure 3F:
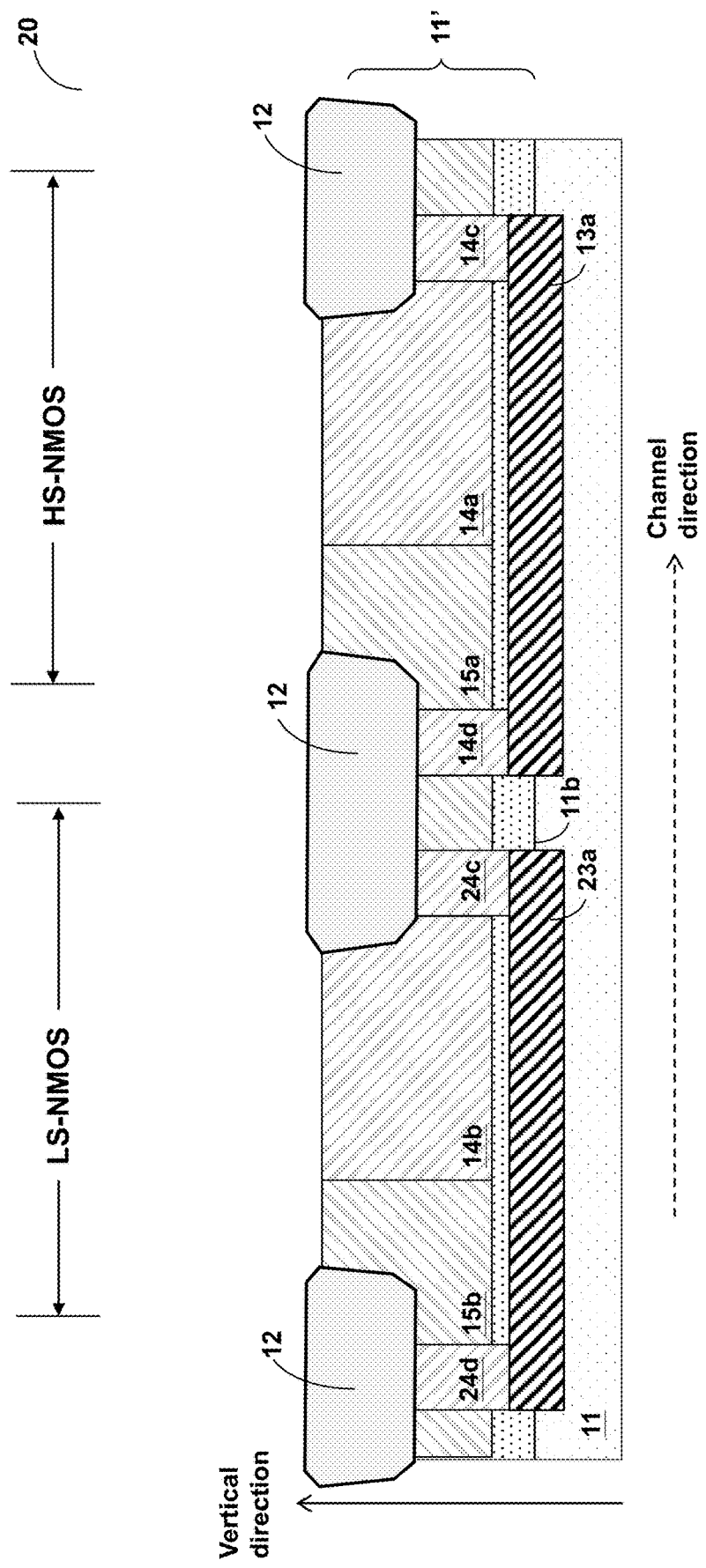
Figure 3G:
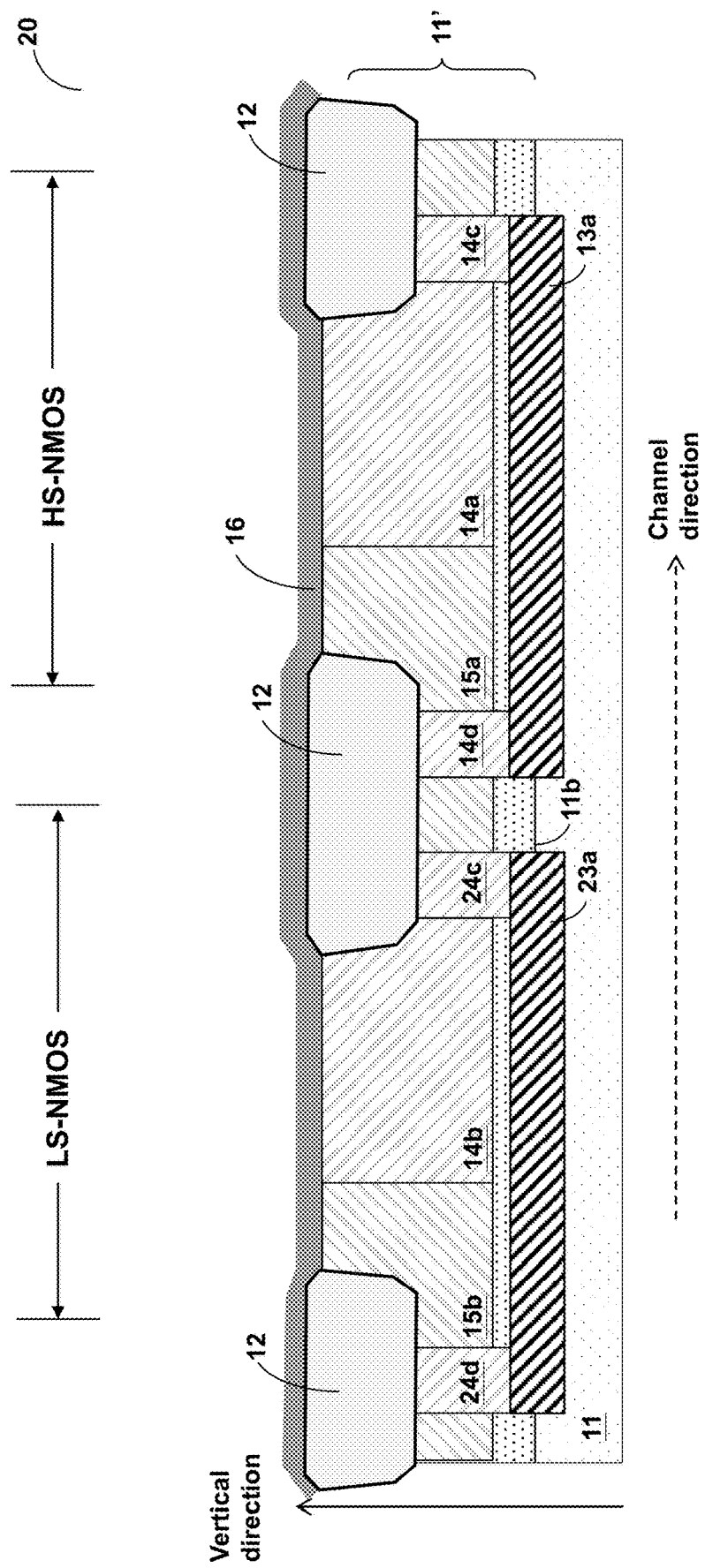
Figure 3H:
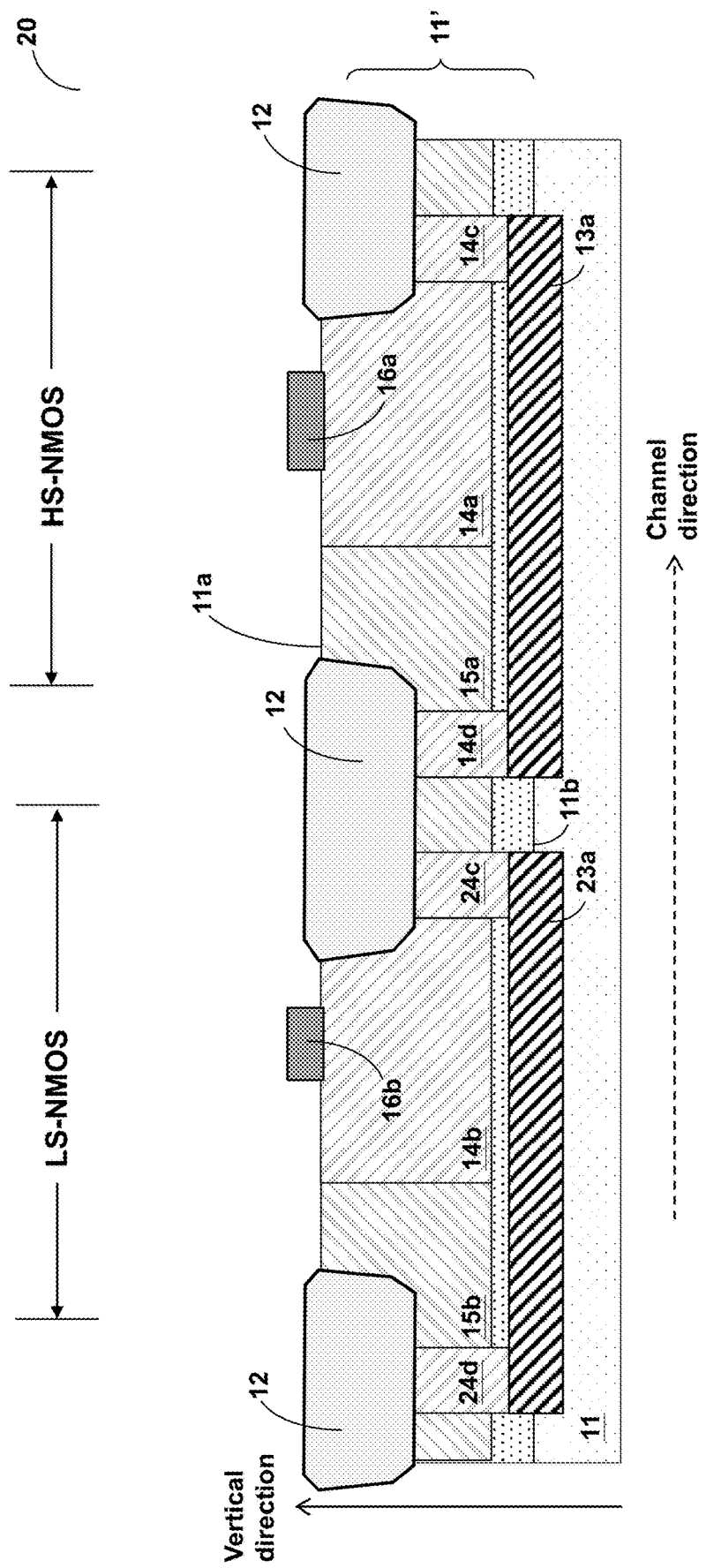
Figure 3L:
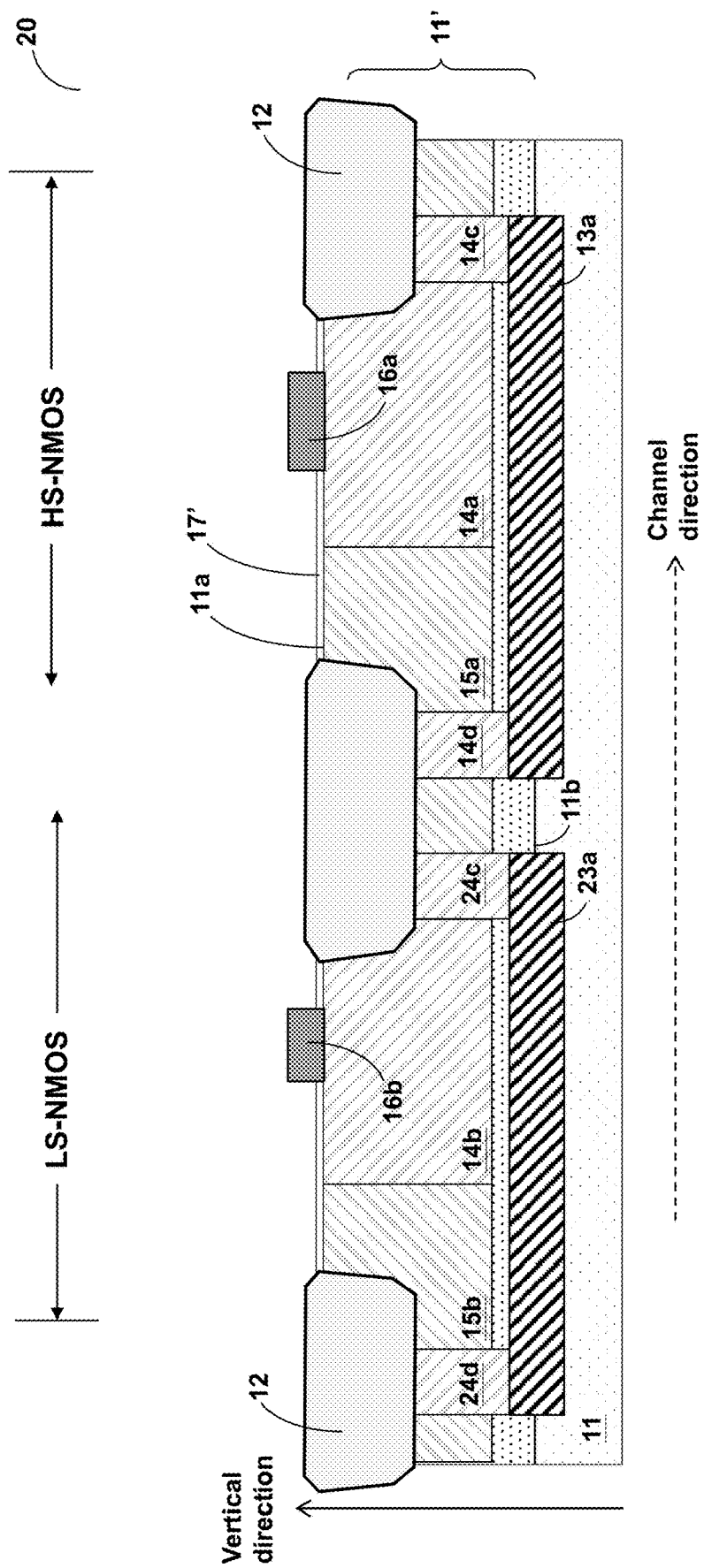
Figure 3J:
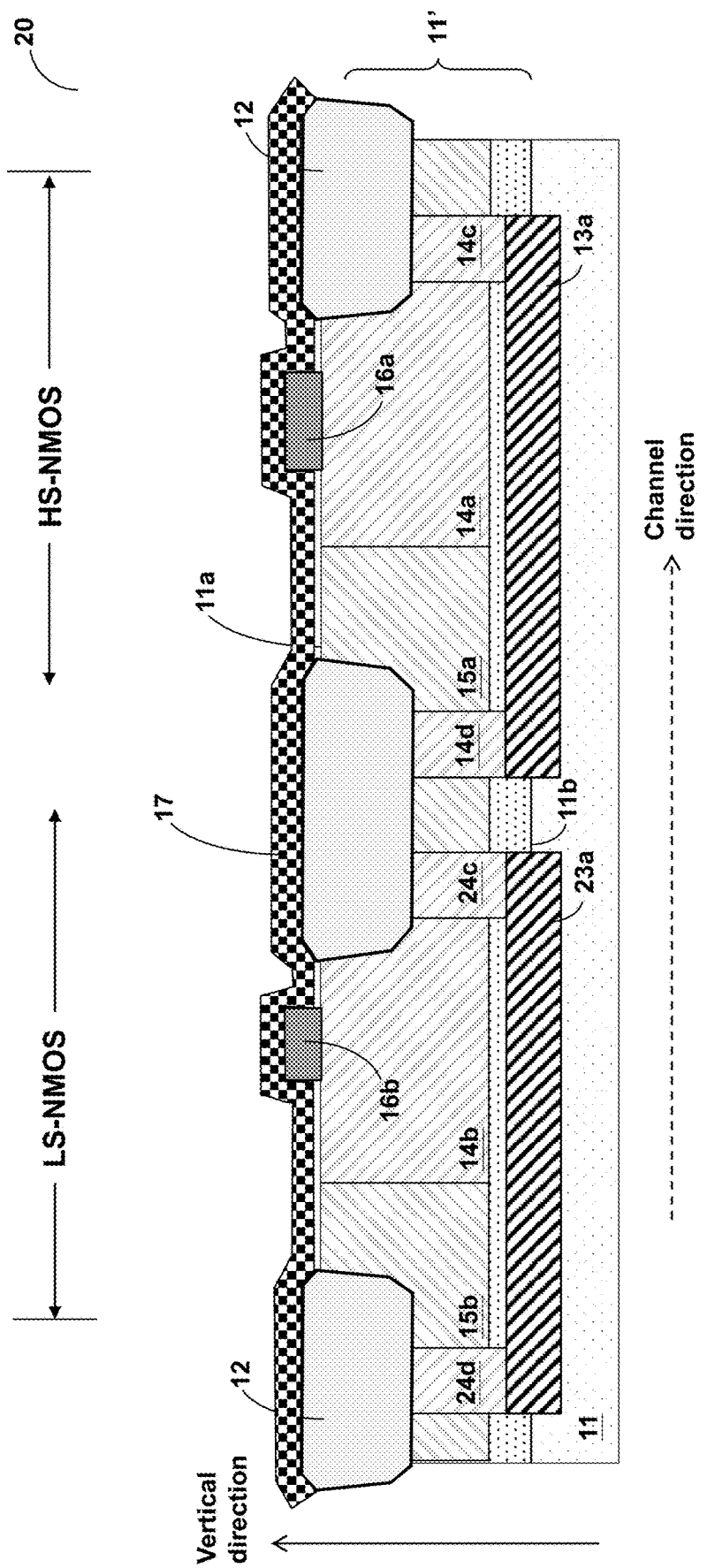
Figure 3K:
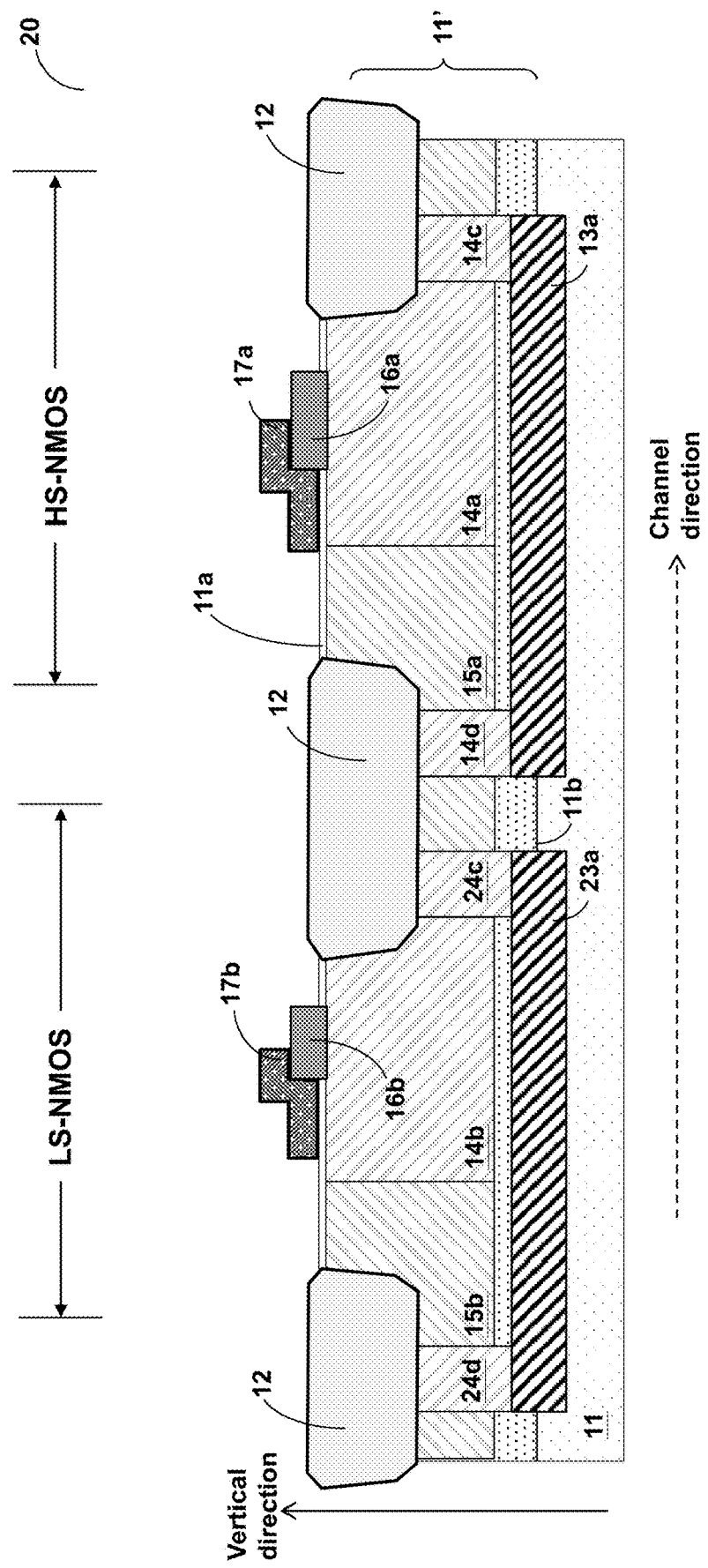
Figure 3L:
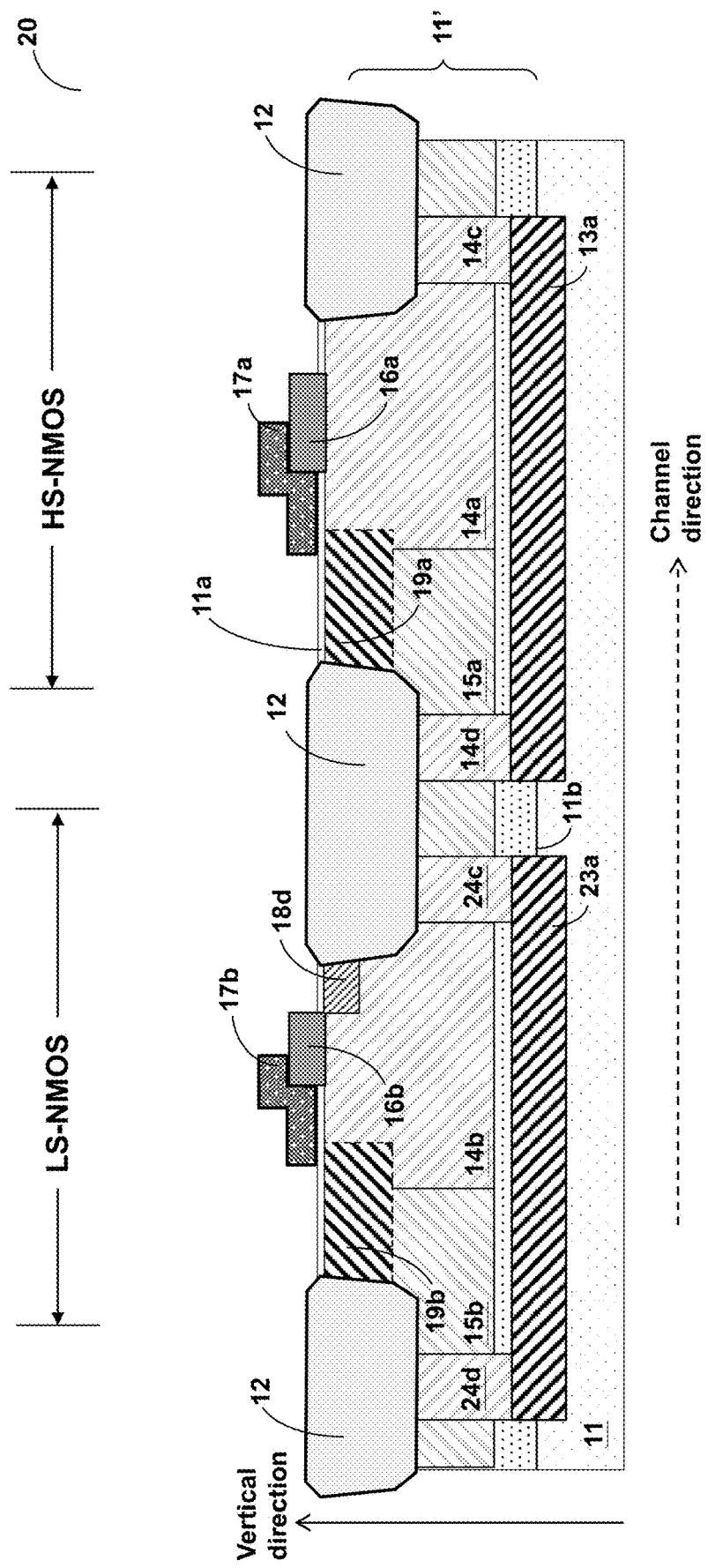
Figure 3M:
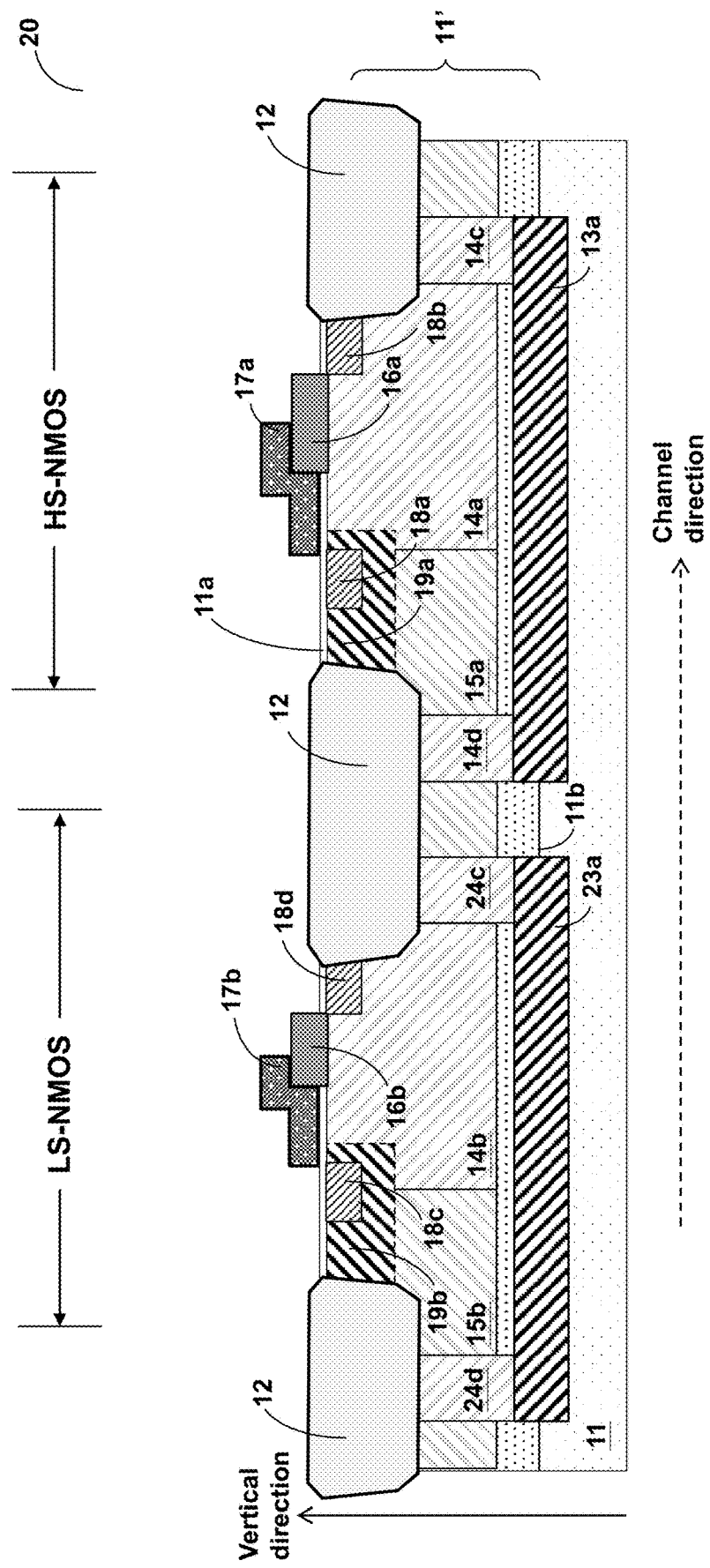
Figure 3N:
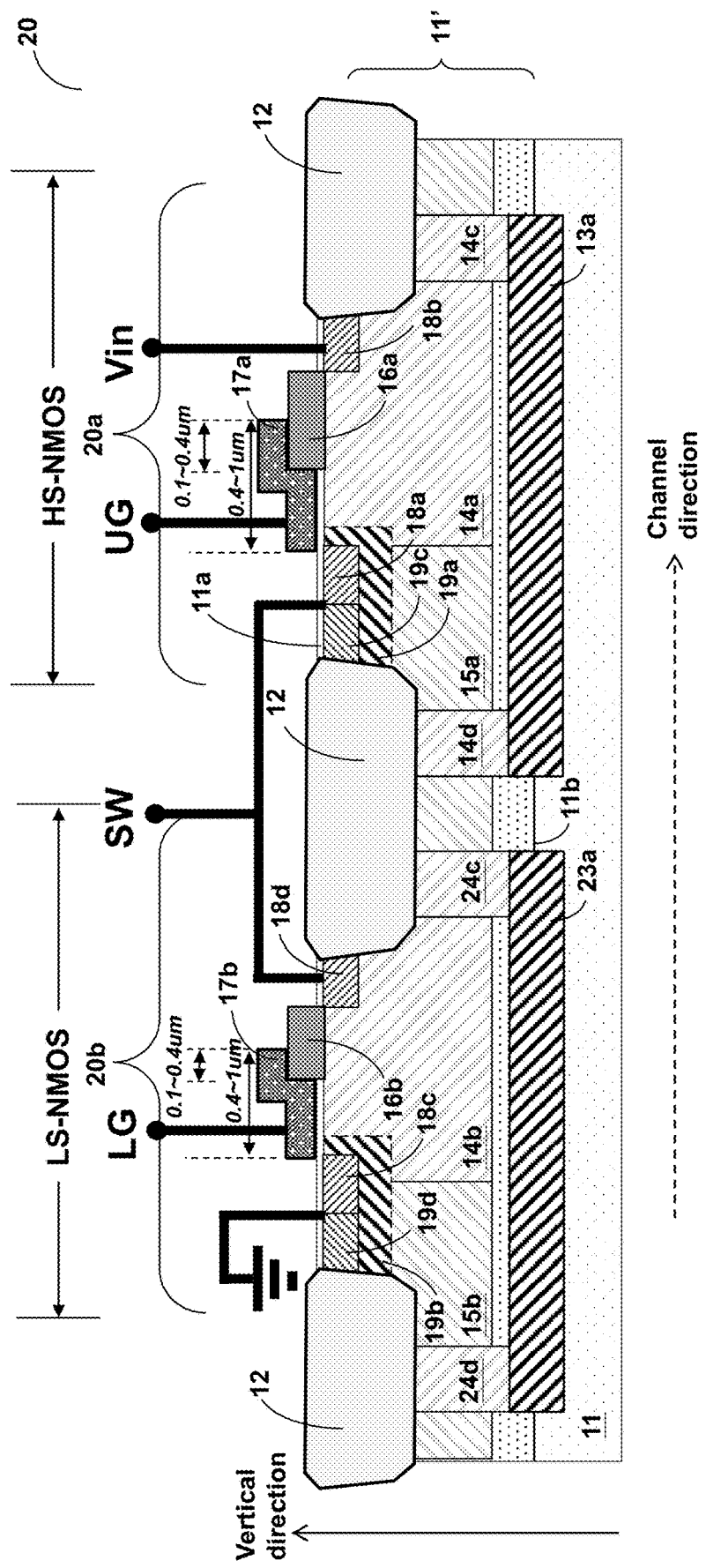

Please refer to FIG. 3A to FIG. 3N, which show cross-section views of a manufacturing method of an NMOS half-bridge power device 20 according to an embodiment of the present invention. The NMOS half-bridge power device 20 includes: an NMOS upper gate device 20a and an NMOS lower gate device 20b. As shown in FIG. 3A, a substrate 11 is provided. And, a first N-type buried layer 13a and a second N-type buried layer 23a are formed, which can be formed by, for example but not limited to, an ion implantation process, which implants N conductivity type impurities in the substrate 11 in the form of accelerated ions. Later, during or subsequent to the formation of a semiconductor layer 11' (as shown in FIG. 3B), the first N-type buried layer 23a and the second N-type buried layer 23b are subject to thermal diffusion to be completely formed.

Next, referring to FIG. 3B, a semiconductor layer 11' is formed on the substrate 11. The semiconductor layer 11', for example, is formed on the substrate 11 by an epitaxial process, or is a part of the substrate 11. As described above, during or subsequent to the formation of the semiconductor layer 11', the first N-type buried layer 13a and the second N-type buried layer 23a thermally diffuse to be completely formed. The semiconductor layer 11' has a top surface 11a and a bottom surface 11b opposite to the top surface 11a in a vertical direction (as indicated by the direction of the solid arrow in FIG. 3B). The semiconductor layer 11' can be formed by various methods known to a person having ordinary skill in the art, so the details thereof are not redundantly explained here. The substrate 11 can be for example a P-type or an N-type semiconductor substrate.

Next, referring to FIG. 3C, plural isolation regions 12 is formed by one same process. The isolation regions 12 can be for example but not limited to a shallow trench isolation (STI) structure. The insulation regions 12 are formed on the semiconductor layer 11', for defining an NMOS upper gate device region HS-NMOS and an NMOS lower gate device region LS-NMOS, wherein the NMOS upper gate device 20a is formed in the NMOS upper gate device region HS-NMOS, whereas, the NMOS lower gate device 20b is formed in the NMOS lower gate device region LS-NMOS.

Next, referring to FIG. 3D, the first N-type high voltage isolation region 14c, the second N-type high voltage isolation region 14d, the third N-type high voltage isolation region 24c and the fourth N-type high voltage isolation region 24d are formed in the semiconductor layer 11' of the NMOS upper gate device region HS-NMOS by one same ion implantation process. In a channel direction (as indicated by the direction of the dashed arrow shown in FIG. 3D), the first N-type high voltage isolation region 14c is in contact with a side of the first N-type high voltage well 14a, wherein this side of the first N-type high voltage well 14a is opposite to another side of the first N-type high voltage well 14a which is in contact with the first P-type high voltage well 15a. In the channel direction, the second N-type high voltage isolation region 14d is in contact with a side of the first P-type high voltage well 15a, wherein this side of the first P-type high voltage well 15a is opposite to another side of the first P-type high voltage well 15a which is in contact with the first N-type high voltage well 14a. The first N-type buried layer 13a, the first N-type high voltage isolation region 14c and the second N-type high voltage isolation region 14d together constitute a device isolation region, wherein such device isolation region entirely encompasses the lower boundary of the NMOS upper gate device 20a below the top surface 11a of the semiconductor layer 11', so that below the top surface 11a of the semiconductor layer 11', the NMOS upper gate device 20a is electrically isolated from other devices which are formed in the semiconductor layer 11', such as the NMOS lower gate device 20b. The second N-type buried layer 23a, the third N-type high voltage isolation region 24c and the fourth N-type high voltage isolation region 24d together constitute a device isolation region, wherein such device isolation region entirely encompasses the lower boundary of the NMOS upper gate device 20b below the top surface 11a of the semiconductor layer 11', so that below the top surface 11a of the semiconductor layer 11', the NMOS upper gate device 20b is electrically isolated from other devices which are formed in the semiconductor layer 11', such as the NMOS lower gate device 20a.

Next, referring to FIG. 3E, the first N-type high voltage well 14a and the second N-type high voltage well 14b are formed in the semiconductor layer 11' of the NMOS upper gate device region HS-NMOS and the semiconductor layer 11' of the NMOS lower gate device region LS-NMOS, respectively, by one same ion implantation process. Both the first N-type high voltage well 14a and the second N-type high voltage well 14b are below and in contact with the top surface 11a. A part of the first N-type high voltage well 14a is located vertically below and in contact with the first gate 17a, which serve as a drift current channel in an ON operation of the NMOS upper gate device 20a. Besides, a part of the second N-type high voltage well 14b is located vertically below and in contact with the second gate 17b, which serve as a drift current channel in an ON operation of the NMOS lower gate device 20b.

Next, referring to FIG. 3F, the first P-type high voltage well 15a and the second P-type high voltage well 15b are formed in the semiconductor layer 11' of the NMOS upper gate device region HS-NMOS and the semiconductor layer 11' of the NMOS lower gate device region LS-NMOS, respectively, by one same ion implantation process. The first N-type high voltage well 14a and the first P-type high voltage well 15a are in contact with each other in the channel direction. The second N-type high voltage well 14b and the second P-type high voltage well 15b are in contact with each other in the channel direction. Both the first P-type high voltage well 15a and the second P-type high voltage well 15b are below and in contact with the top surface 11a.

Next, referring to FIG. 3G, adrift oxide layer 16 is formed on the semiconductor layer 11' by for example but not limited to a deposition process, wherein the drift oxide layer 16 overlays the NMOS upper gate device region HS-NMOS and the NMOS lower gate device region LS-NMOS.

Next, referring to FIG. 3H, the first drift oxide region 16a and the second drift oxide region 16b are formed, by one same etching process including etching a drift oxide layer, in the NMOS upper gate device region HS-NMOS and in the NMOS lower gate device region LS-NMOS, respectively. The first drift oxide region 16a and the second drift oxide region 16b are formed on the semiconductor layer 11', and are located a drift region of the NMOS upper gate device 20a and a drift region of the NMOS lower gate device 20b, respectively.

Next, referring to FIG. 3I, subsequent to the formation of the first drift oxide region 16a and the second drift oxide region 16b, a gate dielectric layer 17' is formed on the semiconductor layer 11', wherein the gate dielectric layer 17' overlays the NMOS upper gate device region HS-NMOS and the NMOS lower gate device region LS-NMOS.

Next, referring to FIG. 3J, subsequent to the formation of the gate dielectric layer 17', a polysilicon layer 17 is formed on the gate dielectric layer 17' by for example but not limited to a deposition process, wherein the polysilicon layer 17 overlays the NMOS upper gate device region HS-NMOS and the NMOS lower gate device region LS-NMOS.

Next, referring to FIG. 3K, subsequent to the formation of the polysilicon layer 17, the polysilicon layer 17 is etched to form a first gate 17a in the NMOS upper gate device region HS-NMOS and to form a second gate 17b in the NMOS lower gate device region LS-NMOS by one same etching process.

Note that the thickness of the gate dielectric layer 17' is significantly thinner than the thickness of the polysilicon layer 17. Subsequent to the formation of the first gate 17a and the second gate 17b, the gate dielectric layer 17' serves to function as a dielectric layer of the first gate 17a and a dielectric layer of the second gate 17b. A transistor device is known to a person having ordinary skill in the art, so the details thereof are not redundantly explained here.

The first gate 17a and the second gate 17b are formed on the top surface 11a of the semiconductor layer 11'. Each of the first gate 17a and the second gate 17b includes: a conductive layer, a spacer layer and a dielectric layer, wherein the dielectric layer is located on and in contact with the top surface 11a, which is known to a person having ordinary skill in the art, so the details thereof are not redundantly explained here.

Next, referring to FIG. 3L, the first P-type body region 19a and the second P-type body region 19b are formed in the semiconductor layer 11' of the NMOS upper gate device region HS-NMOS and the semiconductor layer 11' of the NMOS lower gate device region LS-NMOS, respectively, by one same ion implantation process. The first P-type body region 19a and the first N-type high voltage well 14a are in contact with each other in the channel direction. The second P-type body region 19b and the second N-type high voltage well 14b are in contact with each other in the channel direction.

A portion of the first P-type body region 19a is located vertically below and in contact with the first gate 17a, which serve as an inversion current channel in an ON operation of the NMOS upper gate device 20a. And, a portion of the second P-type body region 19b is located vertically below and in contact with the second gate 17b, which serve as an inversion current channel in an ON operation of the NMOS lower gate device 10b.

Next, referring to FIG. 3M, the first N-type source 18a, the first N-type drain 18b, the second N-type source 18c and the second N-type drain 18d are formed, by one same ion implantation process, in the semiconductor layer 11' of the NMOS upper gate device region HS-NMOS, wherein the first N-type source 18a and the first N-type drain 18b are located below and outside two sides of the first gate 17a in the channel direction, respectively, wherein the side of the first gate 17a which is closer to the first N-type source 18a is a source side and the side of the first gate 17a which is closer to the first N-type drain 18b is a drain side, and wherein the first N-type source 18a is located in the first P-type body region 19a, and the first N-type drain 18b is located in the first N-type high voltage well 14a.

In the vertical direction, the first N-type source 18a and the first N-type drain 18b are formed on and in contact with the top surface 11a. Besides, in the channel direction, a drift region of the NMOS upper gate device 20a lies between the first N-type drain 18b and the first P-type body region 19a, so as to separate the first N-type drain 18b from the first P-type body region 19a. And, a position in the first N-type high voltage well 14a which is near the top surface 11a serves as a drift current channel in an ON operation of the NMOS upper gate device 20a.

The second N-type source 18c and the second N-type drain 18d are located below and outside two sides of the second gate 17b in the channel direction, respectively, wherein the side of the second gate 17b which is closer to the second N-type source 18c is a source side and the side of the second gate 17b which is closer to the second N-type drain 18d is a drain side, and wherein the second N-type source 18c is located in the second P-type body region 19b, and the second N-type drain 18d is located in the second N-type high voltage well 14b.

In the vertical direction, the second N-type source 18c and the second N-type drain 18d are formed on and in contact with the top surface 11a. Besides, in the channel direction, a drift region of the NMOS lower gate device 20b lies between the second N-type drain 18d and the second P-type body region 19b, so as to separate the second N-type drain 18d from the second P-type body region 19b. And, a position in the second N-type high voltage well 14b which is near the top surface 11a serves as a drift current channel in an ON operation of the NMOS lower gate device 20b.

Next, referring to FIG. 3N, the first P-type conductive region 19c and the second P-type conductive region 19d are formed by one same ion implantation process. The first P-type conductive region 19c is formed in the first P-type body region 19a, wherein the first P-type conductive region 19c serves as an electrical contact of the first P-type body region 19a. The second P-type conductive region 19d is formed in the second P-type body region 19c, wherein the second P-type conductive region 19c serves as an electrical contact of the second P-type body region 19b.

The first P-type conductive region 19c and the second P-type conductive region 19d are formed on and in contact with the top surface 11a. Besides, in the channel direction, the first P-type conductive region 19c is in contact with and electrically connected to the first N-type source 18a, whereas, the second P-type conductive region 19d is in contact with and electrically connected to the second N-type source 18c. As shown in FIG. 1, the first P-type conductive region 19c, the first N-type source 18a and the second N-type drain 18d are electrically connected to a switch node voltage SW. In addition, the second P-type conductive region 19d and the second N-type source 18c are electrically connected to ground. The first N-type drain 18b is electrically connected to an input voltage Vin. In a case wherein the NMOS half-bridge power device is applied to a buck power stage circuit, a switch node is electrically connected to one end of an inductor, whereas, another end of the inductor is electrically connected to an output voltage. A buck power stage circuit is known to a person having ordinary skill in the art, so the details thereof are not redundantly explained here.

In one embodiment, the first gate 17a of the NMOS upper gate device 10a has a gate length of 0.4~1 µm. And, a length of a portion where the first gate 17a overlays the first drift oxide region 16a is 0.1~0.4 µm.

In one embodiment, the second gate 17b of the NMOS lower gate device 10b has a gate length of 0.4~1 µm. And, a length of a portion where the second gate 17b overlays the second drift oxide region 16b is 0.1~0.4 µm.

In one embodiment, the semiconductor layer 11' is a P-type semiconductor epitaxial layer having a volume resistivity of 45 Ohm-cm.

In one embodiment, each of the first drift oxide region 16a and the second drift oxide region 16b is a chemical vapor deposition (CVD) oxide region.

In one embodiment, each of the first drift oxide region 16a and the second drift oxide region 16b has a thickness ranging between 400 Å to 450 Å.

In one embodiment, each of the dielectric layer of the first gate 17a and the dielectric layer of the second gate 17b has a thickness ranging between 80 Å to 100 Å.

In one embodiment, a gate driving voltage of the NMOS upper gate device 10a of the NMOS upper gate device region HS-NMOS is 3.3V, and the first N-type drain is electrically connected to a voltage level ranging between 6V and 36V.

In one embodiment, the NMOS half-bridge power device 10 has a minimum feature size of 0.18 µm.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, other process steps or structures, such as a lightly doped drain (LDD) may be added. For another example, the lithography process is not limited to the mask technology but it can also include electron beam lithography. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. An NMOS half-bridge power device, comprising:
a semiconductor layer, which is formed on a substrate;
a plurality of insulation regions, which are formed on the semiconductor layer, for defining an NMOS upper gate device region and an NMOS lower gate device region, wherein an NMOS upper gate device is formed in the NMOS upper gate device region, whereas, an NMOS lower gate device is formed in the NMOS lower gate device region;
a first N-type buried layer, which is formed in the NMOS upper gate device region;
a first N-type high voltage isolation region and a second N-type high voltage isolation region, which are formed in the semiconductor layer of the NMOS upper gate device region by one same ion implantation process;
a first N-type high voltage well and a second N-type high voltage well, which are formed in the semiconductor layer of the NMOS upper gate device region and the semiconductor layer of the NMOS lower gate device region, respectively, by one same ion implantation process;
a first P-type high voltage well and a second P-type high voltage well, which are formed in the semiconductor layer of the NMOS upper gate device region and the semiconductor layer of the NMOS lower gate device region, respectively, by one same ion implantation process; wherein the first N-type high voltage well and the first P-type high voltage well are in contact with each other in a channel direction, and wherein the second N-type high voltage well and the second P-type high voltage well are in contact with each other in the channel direction;
a first drift oxide region and a second drift oxide region, which are formed, by one same etching process including etching a drift oxide layer, in the NMOS upper gate device region and in the NMOS lower gate device region, respectively;
a first gate and a second gate, which are formed, by one same etching process including etching a polysilicon layer, in the NMOS upper gate device region and in the NMOS lower gate device region, respectively;
a first P-type body region and a second P-type body region, which are formed in the semiconductor layer of the NMOS upper gate device region and the semiconductor layer of the NMOS lower gate device region, respectively, by one same ion implantation process; wherein a portion of the first P-type body region is located vertically below the first gate, and wherein the first P-type body region and the first N-type high voltage well are in contact with each other in the channel direction, wherein a portion of the second P-type body region is located vertically below the second gate, and wherein the second P-type body region and the second N-type high voltage well are in contact with each other in the channel direction;
a first N-type source and a first N-type drain, which are formed, by one same ion implantation process, in the semiconductor layer of the NMOS upper gate device region, wherein the first N-type source and the first N-type drain are located below and outside two sides of the first gate, respectively, wherein a side of the first gate which is closer to the first N-type source is a source side and another side of the first gate which is closer to the first N-type drain is a drain side, and wherein the first N-type source is located in the first P-type body region, and the first N-type drain is located in the first N-type high voltage well; and
a second N-type source and a second N-type drain, which are formed in the semiconductor layer of the NMOS lower gate device region by the one same ion implantation process that forms the first N-type source and the first N-type drain, wherein the second N-type source and the second N-type drain are located below and outside two sides of the second gate, respectively, wherein a side of the second gate which is closer to the second N-type source is a source side and another side of the second gate which is closer to the second N-type drain is a drain side, and wherein the second N-type source is located in the second P-type body region, and the second N-type drain is located in the second N-type high voltage well;

wherein the first N-type buried layer is formed in the semiconductor layer and in the substrate and is vertically below the first N-type high voltage well and the first P-type high voltage well;

wherein in the channel direction, the first N-type high voltage isolation region is in contact with a side of the first N-type high voltage well, wherein this side of the first N-type high voltage well is opposite to another side of the first N-type high voltage well which is in contact with the first P-type high voltage well;

wherein in the channel direction, the second N-type high voltage isolation region is in contact with a side of the first P-type high voltage well, wherein this side of the first P-type high voltage well is opposite to another side of the first P-type high voltage well which is in contact with the first N-type high voltage well.

2. The NMOS half-bridge power device of claim 1, further comprising:
a first P-type conductive region, which is formed in the first P-type body region, wherein the first P-type conductive region serves as an electrical contact of the first P-type body region; and
a second P-type conductive region, which is formed in the second P-type body region by the one same ion implantation process that forms the first P-type conductive region, wherein the second P-type conductive region serves as an electrical contact of the second P-type body region.

3. The NMOS half-bridge power device of claim 2, further comprising:
a second N-type buried layer, which is formed in the NMOS lower gate device region; and
a third N-type high voltage isolation region and a fourth N-type high voltage isolation region, which are formed in the semiconductor layer of the NMOS lower gate device region by the one same ion implantation process that forms the first N-type high voltage isolation region and the second N-type high voltage isolation region;

wherein the second N-type buried layer is formed in the semiconductor layer and in the substrate and is vertically below the second N-type high voltage well and the second P-type high voltage well;

wherein in the channel direction, the third N-type high voltage isolation region is in contact with a side of the second N-type high voltage well, wherein this side of the second N-type high voltage well is opposite to another side of the second N-type high voltage well which is in contact with the second P-type high voltage well;

wherein in the channel direction, the fourth N-type high voltage isolation region is in contact with a side of the second P-type high voltage well, wherein this side of the second P-type high voltage well is opposite to another side of the second P-type high voltage well which is in contact with the second N-type high voltage well.

4. The NMOS half-bridge power device of claim 2, wherein the first N-type source is electrically connected to the second N-type source, and wherein the first P-type conductive region is electrically connected to the second N-type source.

5. The NMOS half-bridge power device of claim 1, wherein the first gate of the NMOS upper gate device has a gate length of 0.4~1 μm, and wherein a length of a portion where the first gate overlays the first drift oxide region is 0.1~0.4 μm.

6. The NMOS half-bridge power device of claim 1, wherein the second gate of the NMOS lower gate device has a gate length of 0.4~1 μm, and wherein a length of a portion where the second gate overlays the second drift oxide region is 0.1~0.4 μm.

7. The NMOS half-bridge power device of claim 1, wherein the semiconductor layer is a P-type semiconductor epitaxial layer having a volume resistivity of 45 Ohm-cm.

8. The NMOS half-bridge power device of claim 1, wherein each of the first drift oxide region and the second drift oxide region has a thickness ranging between 400 Å and 450 Å.

9. The NMOS half-bridge power device of claim 1, wherein each of the dielectric layer of the first gate and the dielectric layer of the second gate has a thickness ranging between 80 Å and 100 Å.

10. The NMOS half-bridge power device of claim 1, wherein a gate driving voltage of the NMOS upper gate device region is 3.3V, and wherein the first N-type drain is electrically connected to a voltage level ranging between 6V and 36V.

11. The NMOS half-bridge power device of claim 1, wherein the NMOS half-bridge power device has a minimum feature size of 0.18 μm.

12. A manufacturing method of an NMOS half-bridge power device, wherein the NMOS half-bridge power device includes: an NMOS upper gate device and an NMOS lower gate device; the manufacturing method of the NMOS half-bridge power device comprising steps of:
forming a semiconductor layer on a substrate;
forming a plurality of insulation regions on the semiconductor layer, for defining an NMOS upper gate device region and an NMOS lower gate device region, wherein an NMOS upper gate device is formed in the NMOS upper gate device region, whereas, an NMOS lower gate device is formed in the NMOS lower gate device region;
forming a first N-type buried layer in the NMOS upper gate device region;
forming a first N-type high voltage isolation region and a second N-type high voltage isolation region in the semiconductor layer of the NMOS upper gate device region by one same ion implantation process;
forming a first N-type high voltage well and a second N-type high voltage well in the semiconductor layer of the NMOS upper gate device region and the semiconductor layer of the NMOS lower gate device region, respectively, by one same ion implantation process;
forming a first P-type high voltage well and a second P-type high voltage well in the semiconductor layer of the NMOS upper gate device region and the semiconductor layer of the NMOS lower gate device region, respectively, by one same ion implantation process;
wherein the first N-type high voltage well and the first P-type high voltage well are in contact with each other in a channel direction, and wherein the second N-type high voltage well and the second P-type high voltage well are in contact with each other in the channel direction;

forming a drift oxide layer on the semiconductor layer, wherein the drift oxide layer overlays the NMOS upper gate device region and the NMOS lower gate device region;

etching the drift oxide layer to form a first drift oxide region in the NMOS upper gate device region and to form a second drift oxide region in the NMOS lower gate device region by one same etching process;

subsequent to the formation of the first drift oxide region and the second drift oxide region, forming a gate dielectric layer on the semiconductor layer, wherein the gate dielectric layer overlays the NMOS upper gate device region and the NMOS lower gate device region;

forming a polysilicon layer on the gate dielectric layer, wherein the polysilicon layer overlays the NMOS upper gate device region and the NMOS lower gate device region;

etching the polysilicon layer to form a first gate in the NMOS upper gate device region and to form a second gate in the NMOS lower gate device region by one same etching process;

forming a first P-type body region and a second P-type body region in the semiconductor layer of the NMOS upper gate device region and the semiconductor layer of the NMOS lower gate device region, respectively, by one same ion implantation process; wherein a portion of the first P-type body region is located vertically below the first gate, and wherein the first P-type body region and the first N-type high voltage well are in contact with each other in the channel direction, wherein a portion of the second P-type body region is located vertically below the second gate, and wherein the second P-type body region and the second N-type high voltage well are in contact with each other in the channel direction;

forming a first N-type source and a first N-type drain in the semiconductor layer of the NMOS upper gate device region by one same ion implantation process, wherein the first N-type source and the first N-type drain are located below and outside two sides of the first gate, respectively, wherein a side of the first gate which is closer to the first N-type source is a source side and another side of the first gate which is closer to the first N-type drain is a drain side, and wherein the first N-type source is located in the first P-type body region, and the first N-type drain is located in the first N-type high voltage well; and forming a second N-type source and a second N-type drain in the semiconductor layer of the NMOS lower gate device region by the one same ion implantation process that forms the first N-type source and the first N-type drain, wherein the second N-type source and the second N-type drain are located below and outside two sides of the second gate, respectively, wherein aside of the second gate which is closer to the second N-type source is a source side and another side of the second gate which is closer to the second N-type drain is a drain side, and wherein the second N-type source is located in the second P-type body region, and the second N-type drain is located in the second N-type high voltage well;

wherein the first N-type buried layer is formed in the semiconductor layer and in the substrate and is vertically below the first N-type high voltage well and the first P-type high voltage well;

wherein in the channel direction, the first N-type high voltage isolation region is in contact with a side of the first N-type high voltage well, wherein this side of the first N-type high voltage well is opposite to another side of the first N-type high voltage well which is in contact with the first P-type high voltage well;

wherein in the channel direction, the second N-type high voltage isolation region is in contact with a side of the first P-type high voltage well, wherein this side of the first P-type high voltage well is opposite to another side of the first P-type high voltage well which is in contact with the first N-type high voltage well.

13. The manufacturing method of the NMOS half-bridge power device of claim 12, further comprising:

forming a first P-type conductive region in the first P-type body region, wherein the first P-type conductive region serves as an electrical contact of the first P-type body region; and forming a second P-type conductive region in the second P-type body region by the one same ion implantation process that forms the first P-type conductive region, wherein the second P-type conductive region serves as an electrical contact of the second P-type body region.

14. The manufacturing method of the NMOS half-bridge power device of claim 13, further comprising:

forming a second N-type buried layer in the NMOS lower gate device region; and forming a third N-type high voltage isolation region and a fourth N-type high voltage isolation region in the semiconductor layer of the NMOS lower gate device region by the one same ion implantation process that forms the first N-type high voltage isolation region and the second N-type high voltage isolation region;

wherein the second N-type buried layer is formed in the semiconductor layer and in the substrate and is vertically below the second N-type high voltage well and the second P-type high voltage well;

wherein in the channel direction, the third N-type high voltage isolation region is in contact with a side of the second N-type high voltage well, wherein this side of the second N-type high voltage well is opposite to another side of the second N-type high voltage well which is in contact with the second P-type high voltage well;

wherein in the channel direction, the fourth N-type high voltage isolation region is in contact with a side of the second P-type high voltage well, wherein this side of the second P-type high voltage well is opposite to another side of the second P-type high voltage well which is in contact with the second N-type high voltage well.

15. The manufacturing method of the NMOS half-bridge power device of claim 13, wherein the first N-type source is electrically connected to the second N-type source, and wherein the first P-type conductive region is electrically connected to the second N-type source.

16. The manufacturing method of the NMOS half-bridge power device of claim 12, wherein the first gate of the NMOS upper gate device has a gate length of 0.4~1 μm, and wherein a length of a portion where the first gate overlays the first drift oxide region is 0.1~0.4 μm.

17. The manufacturing method of the NMOS half-bridge power device of claim 12, wherein the second gate of the NMOS lower gate device has a gate length of 0.4~1 μm, and wherein a length of a portion where the second gate overlays the second drift oxide region is 0.1~0.4 μm.

18. The manufacturing method of the NMOS half-bridge power device of claim 12, wherein the semiconductor layer is a P-type semiconductor epitaxial layer having a volume resistivity of 45 Ohm-cm.

19. The manufacturing method of the NMOS half-bridge power device of claim 12, wherein each of the first drift oxide region and the second drift oxide region has a thickness ranging between 400 Å and 450 Å.

20. The manufacturing method of the NMOS half-bridge power device of claim 12, wherein each of the dielectric layer of the first gate and the dielectric layer of the second gate has a thickness ranging between 80 Å and 100 Å.

21. The manufacturing method of the NMOS half-bridge power device of claim 12, wherein a gate driving voltage of the NMOS upper gate device region is 3.3V, and wherein the first N-type drain is electrically connected to a voltage level ranging between 6V and 36V.

22. The manufacturing method of the NMOS half-bridge power device of claim 12, wherein the NMOS half-bridge power device has a minimum feature size of 0.18 μm.

\* \* \* \* \*